(12) United States Patent
Momokawa

(10) Patent No.: US 6,878,884 B2
(45) Date of Patent: Apr. 12, 2005

(54) WIRING BOARD, AND ELECTRONIC DEVICE WITH AN ELECTRONIC PART MOUNTED ON A WIRING BOARD, AS WELL AS METHOD OF MOUNTING AN ELECTRONIC PART ON A WIRING BOARD

(75) Inventor: Yuki Momokawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/419,197

(22) Filed: Apr. 21, 2003

(65) Prior Publication Data
US 2003/0196831 A1 Oct. 23, 2003

(30) Foreign Application Priority Data
Apr. 22, 2002 (JP) ........................................ 2002-118905

(51) Int. Cl.[7] ................................................. H05K 1/16
(52) U.S. Cl. ..................... 174/260; 174/262; 361/760; 361/779
(58) Field of Search ................................. 174/260, 261, 174/262, 266, 263, 264, 265, 250; 361/760, 770, 772, 773, 779, 804, 807

(56) References Cited

U.S. PATENT DOCUMENTS 4,170,819 A * 10/1979 Peter et al. ..................... 29/853
4,410,928 A * 10/1983 Aramaki ....................... 361/760
5,398,166 A * 3/1995 Yonezawa et al. ........... 361/784
5,953,214 A * 9/1999 Dranchak et al. ............ 361/767
6,512,185 B2 * 1/2003 Itou ............................. 174/260
6,657,135 B2 * 12/2003 Suetsugu et al. ............ 174/262

FOREIGN PATENT DOCUMENTS

| JP | 10-051111 | 2/1998 |
| JP | 11-251728 | 9/1999 |
| JP | 2001-244614 | 9/2001 |
| JP | 2001-332851 | 11/2001 |

* cited by examiner

Primary Examiner—Kamand Cuneo
Assistant Examiner—I B Patel
(74) Attorney, Agent, or Firm—McGinn & Gibb, PLLC

(57) ABSTRACT

An electronic device is mounted on a wiring board, which includes: a substrate having through holes, and lands extending on surfaces of the substrate and adjacent to openings of the through holes. Further, at least one coating layer is provided, which coats at least one part of an outer peripheral region of the at least one land, in order to cause that the at least one part is separated from a lead-less solder, thereby preventing any peel of the land from the surface of the substrate.

28 Claims, 31 Drawing Sheets

WIRING BOARD, AND ELECTRONIC DEVICE WITH AN ELECTRONIC PART MOUNTED ON A WIRING BOARD, AS WELL AS METHOD OF MOUNTING AN ELECTRONIC PART ON A WIRING BOARD

BACKGROUND OF THE INVENTION

1. Field of the Invention

The present invention relates to a wiring board, and an electronic device including the wiring board as well as a method of mounting electronic parts on the wiring board, and more particularly to a wiring board suitable for mounting an electronic part thereon by use of a lead-less solder and an electronic device including a wiring board, on which electronic parts are mounted via the lead-less solder, as well as a method of mounting electronic parts on a wiring board by use of the lead-less solder.

All of patents, patent applications, patent publications, scientific articles and the like, which will hereinafter be cited or identified in the present application, will, hereby, be incorporated by references in their entirety in order to describe more fully the state of the art, to which the present invention pertains.

2. Description of the Related Art

FIG. 1 is a fragmentary cross sectional elevation view of a first conventional structure of a wiring board with through holes for mounting an electronic part thereon. FIG. 2 is a fragmentary cross sectional elevation view of the first conventional structure of the wiring board, on which the electronic part is mounted via the through holes. The first conventional structure of the wiring board will be described.

A body of a wiring board 110A comprises a copper-clad lamination substrate 11. This copper-clad lamination substrate 11 comprises an insulating sheet having surfaces coated with copper foils. The insulating sheet may comprise an insulating base material, into which a resin material is infiltrated. Typical examples of the insulating base material may include, but not limited to, paper base materials, glass base materials and a polyester fiber base material. Typical examples of the resin material, to be infiltrated into the insulating base material, may include, but not limited to, an epoxy resin and a phenol resin.

The copper-clad lamination substrate 11 includes at lest a through hole 12. A typical example of shape of the through hole 12 may include, but not limited to, a cylinder shape. An inner wall of the through hole 12 is coated with an electrically conductive film 13 which is further connected or communicated with the copper foils on the surfaces of the copper-clad lamination substrate 11. This electrically conductive film 13 may be formed as follows. A catalyst is applied onto the inner wall of the through hole 12, before an electroless-copper-plating is taken place to form a base copper-plated layer on the inner wall of the through hole 12. Subsequently, an electro-copper-plating is taken place to form a copper-plated layer on the base copper-plated layer, thereby to form the electrically conductive film 13 on the inner wall of the through hole 12. The through hole 12 with the inner wall coated with the electrically conductive film 13 will, hereinafter, be referred to as a through hole 14.

Each of the copper foils on the opposite surfaces of the copper-clad lamination substrate 11 is selectively removed or etched, so that the remaining copper foil on each of the surfaces of the copper-clad lamination substrate 11 comprises a land 15 extending around the through hole 14 and circuit wirings 16 which are connected with the land 15. A typical plan shape of the land 15 is a ring shape, provided that the through hole 14 has a cylinder shape. Typically, the land 15 and the circuit wirings 16 are formed on the opposite surfaces of the copper-clad lamination substrate 11. It may optionally be possible that the land 15 and the circuit wirings 16 are formed on only one surface of the copper-clad lamination substrate 11. The land 15 is preferably small as realizing a high density packaging as possible, as long as a minimum necessary bonding strength is ensured.

The opposite surfaces of the copper-clad lamination substrate 11 are covered by solder resist layers 17, except for the lands 15 and peripheral portions thereof. For example, the circuit wirings 16 on each of the opposite surfaces of the copper-clad lamination substrate 11 are covered by the solder resist layer 17. The solder resist layer 17 serves as a protection layer which protects the surface of the copper-clad lamination substrate 11 from soldering with a tin-lead solder 31, except for the land 15 which is soldered with the tin-lead solder 31 The solder resist layer 17 may be formed by printing a paste on the each surface of the copper-clad lamination substrate 11 and subsequent exposure to a light. The solder resist layer 17 is so formed as not covering the land 15, in order to allow formation of a fillet 31A of the tin-lead solder 31 without any disturbance.

An electric part 20 is mounted on the wiring board 110A. The electric part 20 has a body 21 and a plurality of leads 22, one of which is shown in FIG. 2. The lead 22 is inserted into the through hole 14 of the wiring board 110A, so that the lead 22 completely penetrates the through hole 14, whereby a top of the lead 22 projects from the opposite surface to the surface in the side of the electric part 20. The lead 22 is bonded to the through hole 14 via the tin-lead solder 31. Since the solder resist layer 17 is so formed as not covering the land 15, the fillet 31A of the tin-lead solder 31 is formed. A typical example of the tin-lead solder 31 is a tin-lead eutectic solder containing 63% by weight of Sn and 37% by weight of Pb, which will hereinafter be referred to as Pb-63Sn. The tin-lead solder 31 relaxes a stress which is caused by a miss-match or a difference in thermal expansion coefficient between different materials of the lead 22 and the copper-clad lamination substrate 11, whereby no defect is caused on the connection between the electric part 20 and the wiring board 110A.

The use of the tin-lead solder 31 is not preferable in view that the lead provides an environmental impact. For this reason, some lead-less solders have been often used recently in view of the environmental requirement. A typical one of the lead-less solders includes tin as a main component, and further silver, copper, zinc, bismuth, indium, antimony, nickel, and germanium as additional components. The above-described Pb-63Sn solder has a melting point of 183° C. A melting point of the lead-less solder is ranged from 190° C.–230° C., which is higher than the melting point of the Pb-63Sn solder.

A base material of the wiring board 110A is an epoxy-based material which has a glass transition temperature in the range of 125° C.–140° C. The use of the lead-less solder instead of the above Pb-63Sn solder results in an increased difference in solidifying shrinkage temperature between the solder and the copper-clad lamination substrate 11 of the wiring board 110A. The copper-clad lamination substrate 11 shows an expansion in the soldering process, and a contraction after the soldering process. The lead-less solder shows a larger tensile strength and a larger creep strength than the above Pb-63Sn solder. The lead-less solder shows a smaller elongation as compared to the above Pb-63Sn solder. Those properties of the lead-less solder disturb the desired stress relaxation. The use of the lead-less solder to mount the electric part 20 on the conventional wiring board 110A often causes a peel of the land 15, even the use of the above Pb-63Sn solder does not cause any peel of the land 15.

FIG. 3 is a photograph which shows the land 15 as peeled and floated from the surface of the copper-clad lamination substrate 11 of the wiring board 110A through a soldering process using a lead-less solder 32. FIG. 4 is a photograph showing that a boundary between the land 15 and the circuit wiring 16 is deformed and disconnected after the temperature cyclic test has been carried out. If the soldering process using a lead-less solder 32 is applied to the conventional wiring board 110A, then the land 15 is peeled and floated from the surface of the copper-clad lamination substrate 11. The circuit wiring 16 connected with the land 15 is also risen upon floating of the land 15, whereby the circuit wiring 16 receives an excessive tensile stress. Thereafter, 200 cycles of heating and cooling processes are taken place as a temperature cyclic test in order to apply a thermal stress to the wiring board 110A, whereby the boundary between the land 15 and the circuit wiring 16 is largely deformed and disconnected as shown in FIG. 4. This verifying test verifies that the combined use of the lead-less solder and the conventional wiring board 110A results in a remarkable deterioration in reliability of the electronic device which includes the electronic part 20 mounted on the wiring board 110A via the lead-less solder.

Japanese laid-open patent publication No. 2001-332851 discloses a conventional method of suppressing the peel of the land. FIG. 5 is a fragmentary cross sectional elevation view of a second conventional structure of a wiring board, on which an electronic part is mounted via the through holes, as disclosed in the above Japanese publication. This second conventional structure of the wiring board shown in FIG. 5 is different from the above-described first conventional structure of the wiring board shown in FIG. 2 in that a wiring board 110B has a modified solder resist layer 117 having an extension portion 117A, which overlies a peripheral region of the land 15 for suppressing or preventing the land 15 from being peeled.

It is the fact that a large number of the read-made products are as shown in FIG. 2 and free of any countermeasure to suppress the peeling of the land 15. In case that the electronic part 20 becomes defect and should be replaced by a new electronic part, if the new electronic part may be mounted on the wiring board 110A by use of a lead-less solder 32, then this may cause that the land 15 is peeled as described above. In order to avoid this problem, it may be effective that instead of the above wiring board 110A, the new electronic part is mounted onto the wiring board 110B.

Manufacturing of the wiring board 110B needs to design a new jig for printing a predetermined pattern of a paste of the solder resist 117 and formation of the solder resist layer 117 by use of the newly designed jig. This may result in an increased manufacturing cost of the repaired product. Disposal of the above wiring board 110A makes the non-defective wiring board 110A wasted. These disadvantages in manufacturing of the wiring board 110B are caused not only in repairing the ready-made products but also manufacturing the new products.

In the above circumstances, the development of a novel technique free from the above problems is desirable.

SUMMARY OF THE INVENTION

Accordingly, it is an object of the present invention to provide a novel wiring board free from the above problems.

It is a further object of the present invention to provide a novel wiring board which allows an electronic part to be mounted via a lead-less solder with no peel of the land nor increase in the manufacturing cost.

It is a still further object of the present invention to provide a novel electronic device including an improved wiring board free from the above problems.

It is yet a further object of the present invention to provide a novel electronic device including an improved wiring board which allows an electronic part to be mounted via a lead-less solder with no peel of the land nor increase in the manufacturing cost.

It is further more object of the present invention to provide a novel method of mounting an electronic part on an improved wiring board free from the above problems.

It is moreover object of the present invention to provide a novel method of mounting an electronic part on an improved wiring board, which allows an electronic part to be mounted via a lead-less solder with no peel of the land nor increase in the manufacturing cost.

The present invention provides a wiring board, which includes: a substrate having at least one through hole; at least one land extending on at least one surface of the substrate, and the at least one land extending adjacent to an opening of the at least one through hole; and at least one coating layer which coats at least one part of an outer peripheral region of the at least one land.

The present invention also provides an electronic device comprising: a wiring board having at least one through hole; and an electronic part being mounted on the wiring board, and the electronic part having at least one lead being inserted into the at least one through hole and being bonded to the at least one through hole via a lead-less solder, and wherein the wiring board includes: a substrate having the at least one through hole; at least one land extending on at least one surface of the substrate, and the at least one land extending adjacent to an opening of the at least one through hole; and at least one coating layer which coats at least one part of an outer peripheral region of the at least one land, so that the at least one part of the outer peripheral region of the at least one land is separated from the lead-less solder.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

Figure 1:
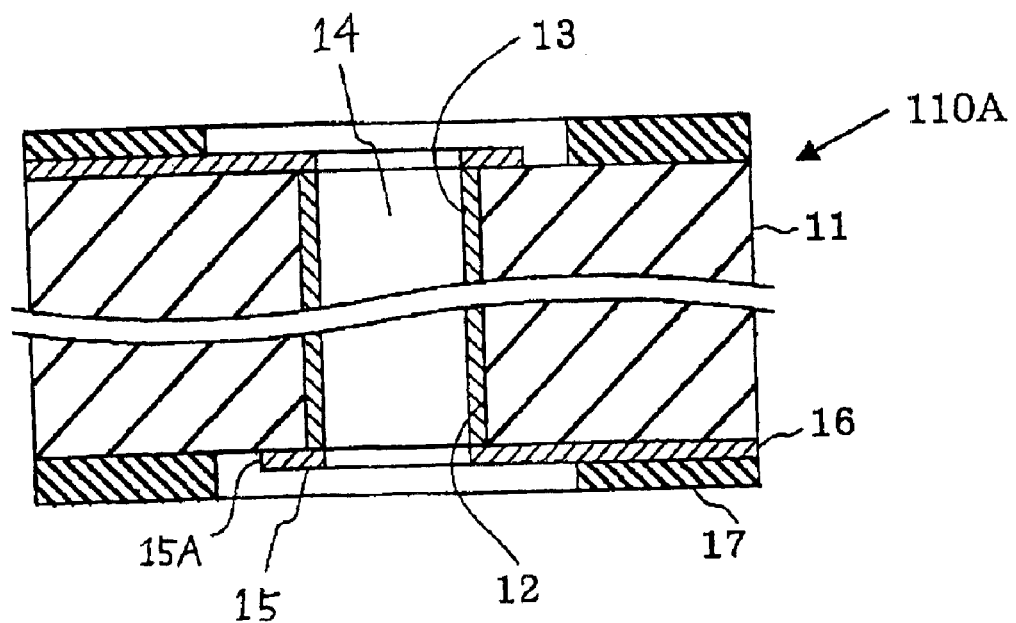
FIG. 1 is a fragmentary cross sectional elevation view of a first conventional structure of a wiring board with through holes for mounting an electronic part thereon.
Figure 2:
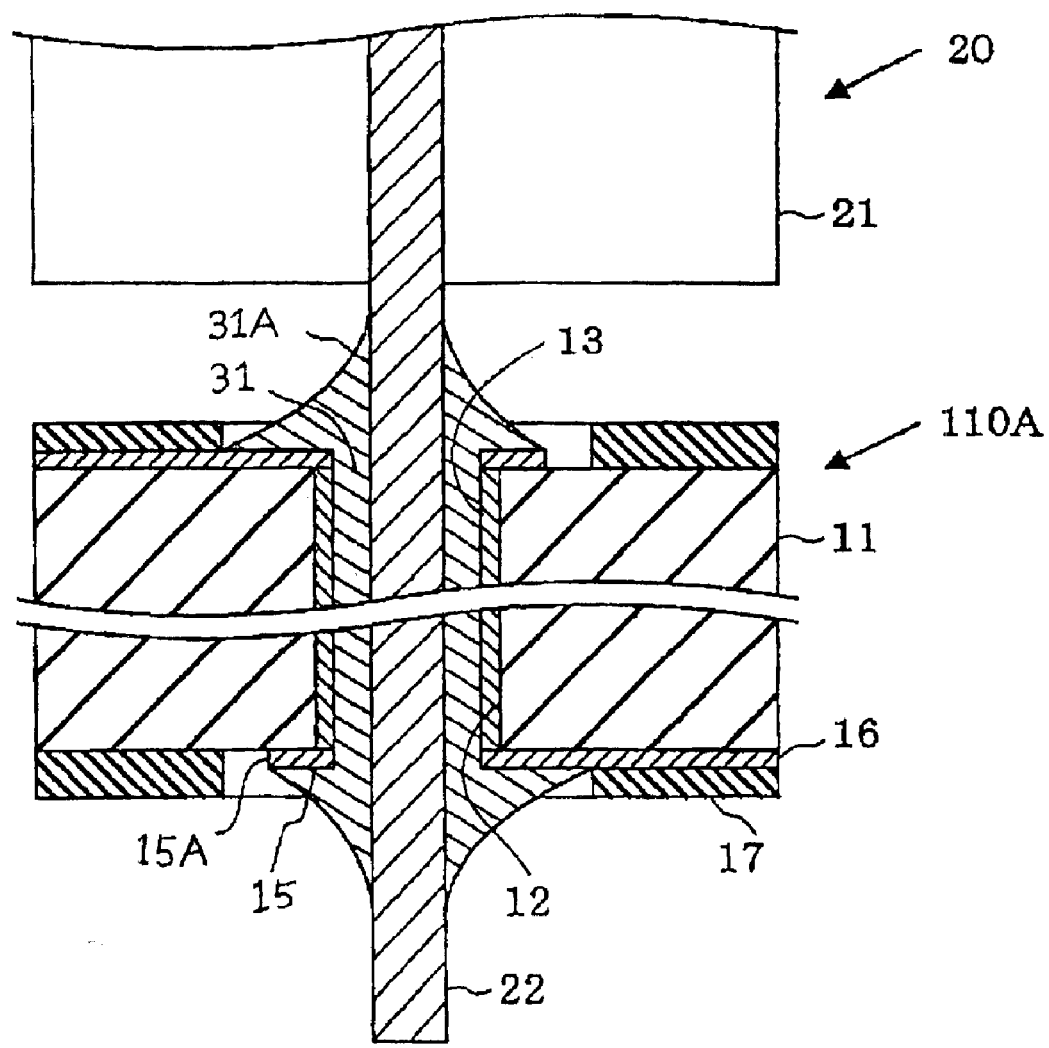
FIG. 2 is a fragmentary cross sectional elevation view of the first conventional structure of the wiring board, on which the electronic part is mounted via the through holes.
Figure 3:
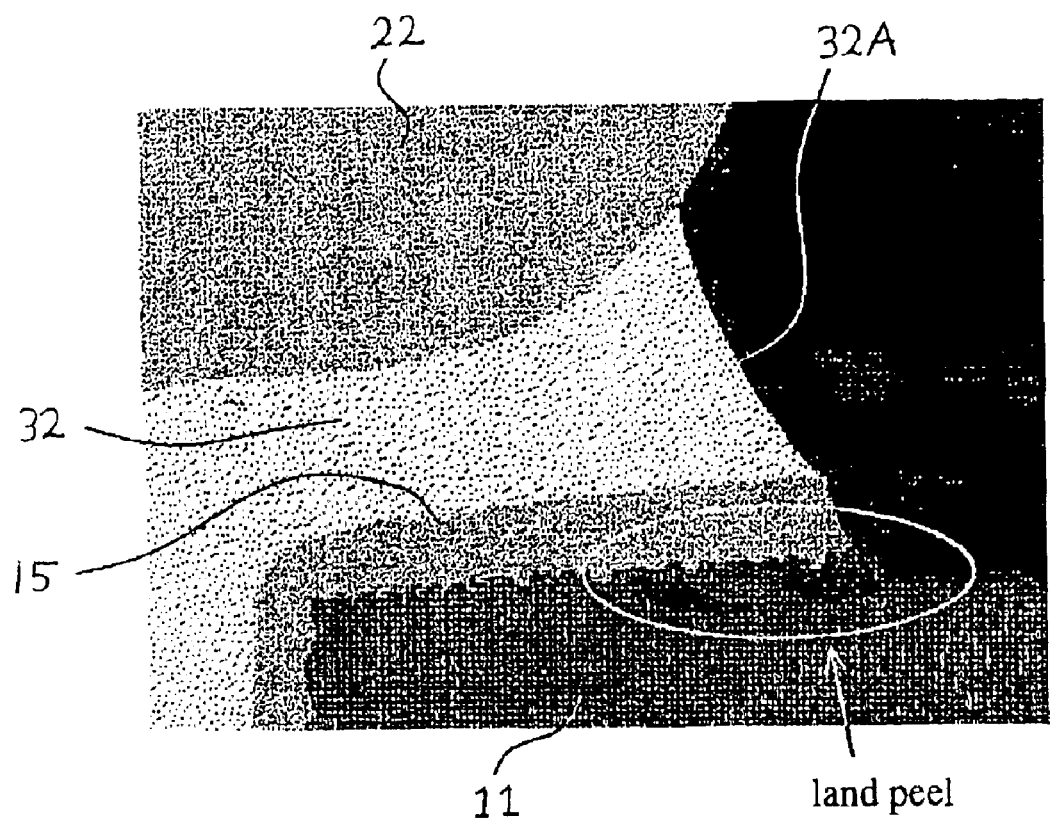
FIG. 3 is a photograph which shows the land as peeled and floated from the surface of the copper-clad lamination substrate of the wiring board through a soldering process using a lead-less solder.
Figure 4:
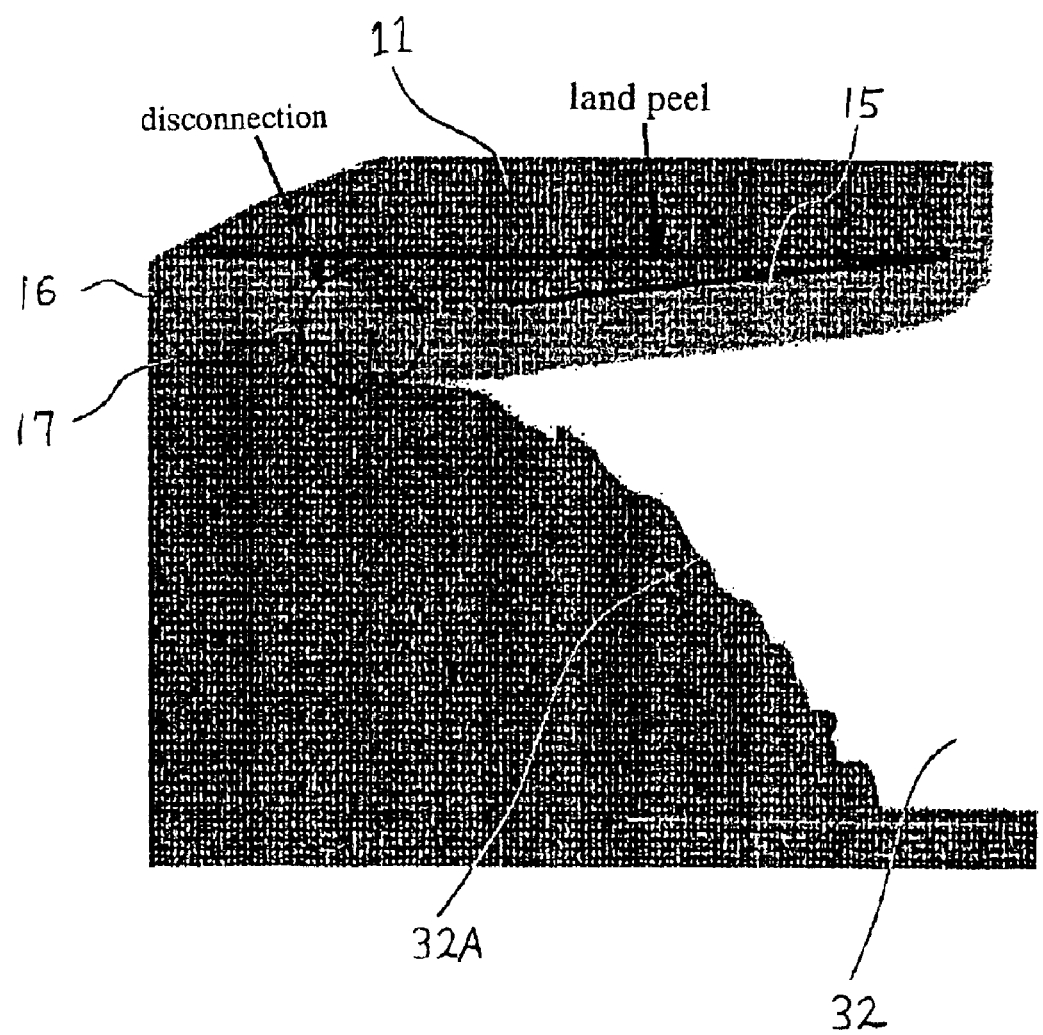
FIG. 4 is a photograph showing that a boundary between the lad and the circuit wiring is deformed and disconnected after the temperature cyclic test has been carried out.

A first aspect of the present invention is a wiring board, which includes: a substrate having at least one through hole; at least one land extending on at least one surface of the substrate, and the at least one land extending adjacent to an opening of the at least one through hole; and at least one coating layer which coats at least one part of an outer peripheral region of the at least one land.

It is possible to further include: a first conductive film extending on an inner wall of the at least one through hole, and the first conductive film being connected with the at least one land;

at least one circuit wiring extending on the at least one surface of the substrate, and the at least one circuit wiring being connected with a connecting part of an outer peripheral region of the at least one land; and at least one protection film covering the at least one circuit wiring.

It is also possible that the at least one coating layer omnidirectionally coats an entirety of the outer peripheral region of the at least one land.

It is also possible that the at least one coating layer coats an entirety of the at least one land.

It is also possible that the at least one coating layer coats the connecting part adjacent to the at least one circuit wiring.

It is also possible that the at least one coating layer coats an opposite part of the outer peripheral region of the at least one land, and the opposite part is positioned opposite to the connecting part adjacent to the at least one circuit wiring.

It is also possible that the at least one coating layer coats both the connecting part adjacent to the at least one circuit wiring and an opposite part of the outer peripheral region of the at least one land, and the opposite part is positioned opposite to the connecting part adjacent to the at least one circuit wiring.

It is also possible that the at least one coating layer coats an entirety of the at least one land and the at least one through hole.

It is also possible to further include a sub-land region at a boundary between the at least one land and the at least one circuit wiring, and the sub-land region is wider than the at least one circuit wiring and narrower than a horizontal size of the at least one land.

It is also possible that the at least one coating layer comprises a material having a thermal stability at a temperature of a melting point of a lead-less solder. The lead-less solder may be one selected from the groups consisting of tin-zinc-based solders, tin-silver-based solders, and tin-copper-based solders.

A second aspect of the present invention is a wiring board, which includes: a substrate having at least one through hole, and the substrate having a first surface and a second surface opposite to the first surface;

a first conductive film extending on an inner wall of the at least one through hole;

at least one first-side circuit wiring extending on the first surface of the substrate;

at least one second-side circuit wiring extending on the second surface of the substrate;

at least one first-side protection film covering the at least first-side circuit wiring on the first surface of the substrate;

at least one second-side protection film covering the at least second-side circuit wiring on the second surface of the substrate;

at least one first-side land extending on the first surface of the substrate, and the at least one first-side land extending adjacent to a first-side opening of the at least one through hole, and the at least one first-side land being connected with the first conductive film and also with the at least one first-side circuit wiring;

at least one second-side land extending on the second surface of the substrate, and the at least one second-side land extending adjacent to a second-side opening of the at least one through hole, and the at least one second-side land being connected with the first conductive film and also with the at least one second-side circuit wiring;

at least one first-side coating layer extending on the first surface of the substrate, and the at least one first-side coating layer coating at least one part of an outer peripheral region of the at least one first-side land; and at least one second-side coating layer extending on the second surface of the substrate, and the at least one second-side coating layer coating at least one part of an outer peripheral region of the at least one second-side land.

It is also possible that the at least one first-side coating layer omnidirectionally coats an entirety of the outer peripheral region of the at least one first-side land, and the at least one second-side coating layer omnidirectionally coats an entirety of the outer peripheral region of the at least one second-side land.

It is also possible that the at least one first-side coating layer coats an entirety of the at least one first-side land, and the at least one second-side coating layer coats an entirety of the at least one second-side land.

It is also possible that the at least one first-side coating layer coats a first-side connecting part of the at least one first-side land, and the first-side connecting part being adjacent to the at least one first-side circuit wiring, and the at least one second-side coating layer coats a second-side connecting part of the at least one second-side land, and the second-side connecting part being adjacent to the at least one second-side circuit wiring.

It is also possible that the at least one first-side coating layer coats a first-side opposite part of the outer peripheral region of the at least one first-side land, and the first-side opposite part is positioned opposite to a first-side connecting part of the at least one first-side land, and the first-side connecting part being adjacent to the at least one first-side circuit wiring, and the at least one second-side coating layer coats a second-side opposite part of the outer peripheral region of the at least one second-side land, and the second-side opposite part is positioned opposite to a second-side connecting part of the at least one second-side land, and the second-side connecting part being adjacent to the at least one second-side circuit wiring.

It is also possible that the at least one first-side coating layer coats both a first-side connecting part of the at least one first-side land and a first-side opposite part of the outer peripheral region of the at least one first-side land, and the first-side opposite part is positioned opposite to the first-side connecting part adjacent to the at least one first-side circuit wiring, and the at least one second-side coating layer coats both a second-side connecting part of the at least one second-side land and a second-side opposite part of the outer peripheral region of the at least one second-side land, and the second-side opposite part is positioned opposite to the second-side connecting part adjacent to the at least one second-side circuit wiring.

It is also possible that the at least one first-side coating layer coats an entirety of the at least one first-side land and the first-side opening of the at least one through hole, and the at least one second-side coating layer omnidirectionally coats an entirety of the outer peripheral region of the at least one second-side land.

It is also possible that the at least one first-side coating layer coats an entirety of the at least one first-side land and the first-side opening of the at least one through hole, and the at least one second-side coating layer coats an entirety of the at least one second-side land.

It is also possible that the at least one first-side coating layer coats an entirety of the at least one first-side land and the first-side opening of the at least one through hole, and the at least one second-side coating layer coats a second-side connecting part of the at least one second-side land, and the second-side connecting part being adjacent to the at least one second-side circuit wiring.

It is also possible that the at least one first-side coating layer coats an entirety of the at least one first-side land and the first-side opening of the at least one through hole, and the at least one second-side coating layer coats a second-side opposite part of the outer peripheral region of the at least one second-side land, and the second-side opposite part is positioned opposite to a second-side connecting part of the at least one second-side land, and the second-side connecting part being adjacent to the at least one second-side circuit wiring.

It is also possible that the at least one first-side coating layer coats an entirety of the at least one first-side land and the first-side opening of the at least one through hole, and the at least one second-side coating layer coats both a second-side connecting part of the at least one second-side land and a second-side opposite part of the outer peripheral region of the at least one second-side land, and the second-side opposite part is positioned opposite to the second-side connecting part adjacent to the at least one second-side circuit wiring.

It is also possible to further include a sub-land region at a boundary between the at least one land and the at least one circuit wiring, and the sub-land region is wider than the at least one circuit wiring and narrower than a horizontal size of the at least one land.

It is also possible that the at least one coating layer comprises a material having a thermal stability at a temperature of a melting point of a lead-less solder. The lead-less solder may be one selected from the groups consisting of tin-zinc-based solders, tin-silver-based solders, and tin-copper-based solders.

A third aspect of the present invention is an electronic device comprising: a wiring board having at least one through hole; and an electronic part being mounted on the wiring board, and the electronic part having at least one lead being inserted into the at least one through hole and being bonded to the at least one through hole via a lead-less solder, and wherein the wiring board includes: a substrate having the at least one through hole; at least one land extending on at least one surface of the substrate, and the at least one land extending adjacent to an opening of the at least one through hole; and at least one coating layer which coats at least one part of an outer peripheral region of the at least one land, so that the at least one part of the outer peripheral region of the at least one land is separated from the lead-less solder.

It is also possible that the wiring board further includes:

a first conductive film extending on an inner wall of the at least one through hole, and the first conductive film being connected with the at least one land;

at least one circuit wiring extending on the at least one surface of the substrate, and the at least one circuit wiring being connected with a connecting part of the outer peripheral region of the at least one land; and at least one protection film covering the at least one circuit wiring.

It is also possible that the at least one coating layer omnidirectionally coats an entirety of the outer peripheral region of the at least one land, so that the entirety of the outer peripheral region of the at least one land is separated from the lead-less solder.

It is also possible that the at least one coating layer coats an entirety of the at least one land, so that the entirety of the at least one land is separated from the lead-less solder.

It is also possible that the at least one coating layer coats the connecting part adjacent to the at least one circuit wiring, so that the connecting part is separated from the lead-less solder.

It is also possible that the at least one coating layer coats an opposite part of the outer peripheral region of the at least one land, so that the opposite part of the outer peripheral region of the at least one land is separated from the lead-less solder, and the opposite part is positioned opposite to the connecting part adjacent to the at least one circuit wiring.

It is also possible that the at least one coating layer coats both the connecting part adjacent to the at least one circuit wiring and an opposite part of the outer peripheral region of the at least one land, so that both the connecting part and the opposite part are separated from the lead-less solder, and the opposite part is positioned opposite to the connecting part adjacent to the at least one circuit wiring.

It is also possible that the at least one coating layer coats an entirety of the at least one land and the at least one through hole, so that the lead-less solder is confined within the at least one through hole.

It is also possible that the wiring board further includes a sub-land region at a boundary between the at least one land and the at least one circuit wiring, and the sub-land region is wider than the at least one circuit wiring and narrower than a horizontal size of the at least one land.

It is also possible that the at least one coating layer comprises a material having a thermal stability at a temperature of a melting point of a lead-less solder.

It is also possible that the lead-less solder is one selected from the groups consisting of tin-zinc-based solders, tin-silver-based solders, and tin-copper-based solders.

It is also possible that the at least one coating layer is provided on a first surface of the substrate, and the first surface faces to the electronic part, so that the at least one part of the outer peripheral region of the at least one land is separated from the lead-less solder, and that a second-side projecting length of the at least one lead from a second surface of the substrate is not greater than one half of a horizontal size of the at least one land on the second surface, where the second-side projecting length is defined to be a length of a projecting part of the at least one lead, which projects from the second surface of the substrate, and the land on the second surface of the substrate is in contact with a flat fillet of the lead-less solder. The second-side projecting length may be not greater than zero, and the at least one lead is free of any second-side project part from the second surface of the substrate.

It is also possible that at least one spacer is provided between the electronic part and a first surface of the substrate, and the first surface faces to the electronic part, so that the at least one part of the outer peripheral region of the at least one land is separated from the lead-less solder, and that a second-side projecting length of the at least one lead from a second surface of the substrate is not greater than one half of a horizontal size of the at least one land on the second surface, where the second-side projecting length is defined to be a length of a projecting part of the at least one lead, which projects from the second surface of the substrate, and the land on the second surface of the substrate is in contact with a flat fillet of the lead-less solder.

It is also possible that the second-side projecting length is not greater than zero, and the at least one lead is free of any second-side project part from the second surface of the substrate.

It is also possible that at least an adjacent part of a first-side projecting part of the at least one lead from a first surface of the substrate is coated with a coating film having a lower reactivity to the lead-less solder in a melt state than the at least one lead, and the first surface faces to the electronic part, and the adjacent part of the first-side projecting part is adjacent to a first-side opening of the at least one through hole, so that an entirety of the at least one land on the first surface of the substrate is separated from the lead-less solder, and that the at least one coating layer is provided on a second surface of the substrate, so that the at least one part of the outer peripheral region of the at least one land on the second surface is separated from the lead-less solder.

It is also possible that an entirety of the first-side projecting part of the at least one lead is coated with the coating film.

It is also possible that the at least one coating layer is provided on a first surface of the substrate, and the first surface faces to the electronic part, so that the at least one part of the outer peripheral region of the at least one land on the first surface is separated from the lead-less solder, and that at least an adjacent part of a second-side projecting part of the at least one lead from a second surface of the substrate is coated with a coating film having a lower reactivity to the lead-less solder in a melt state than the at least one lead, and the adjacent part of the second-side projecting part is adjacent to a second-side opening of the at least one through hole, so that an entirety of the at least one land on the second surface of the substrate is separated from the lead-less solder.

It is also possible that an entirety of the second-side projecting part of the at least one lead is coated with the coating film.

A fourth aspect of the present invention is an electronic device comprising: a wiring board having at least one through hole; and an electronic part being mounted on the wiring board, and the electronic part having at least one lead being inserted into the at least one through hole and being bonded to the at least one through hole via a lead-less solder, and that the wiring board includes: a substrate having the at least one through hole; and at least one land extending on at least one surface of the substrate, and the at least one land extending adjacent to an opening of the at least one through hole, and that at least one part of an outer peripheral region of the at least one land is separated from the lead-less solder.

It is also possible that the wiring board further includes:

a first conductive film extending on an inner wall of the at least one through hole, and the first conductive film being connected with the at least one land;

at least one circuit wiring extending on the at least one surface of the substrate, and the at least one circuit wiring being connected with a connecting part of the outer peripheral region of the at least one land; and at least one protection film covering the at least one circuit wiring.

It is also possible that the entirety of the outer peripheral region of the at least one land is separated from the lead-less solder.

It is also possible that the entirety of the at least one land is separated from the lead-less solder.

It is also possible that the connecting part is separated from the lead-less solder.

It is also possible that an opposite part of the outer peripheral region of the at least one land is separated from the lead-less solder, and the opposite part is positioned opposite to the connecting part adjacent to the at least one circuit wiring.

It is also possible that both the connecting part and an opposite part of the outer peripheral region of the at least one land are separated from the lead-less solder, and the opposite part is positioned opposite to the connecting part adjacent to the at least one circuit wiring.

It is also possible that the lead-less solder is confined within the at least one through hole.

A fifth aspect of the present invention is an electronic device comprising: a wiring board having at least one through hole; and an electronic part being mounted on the wiring board, and the electronic part having at least one lead being inserted into the at least one through hole and being bonded to the at least one through hole via a lead-less solder, and wherein the wiring board includes: a substrate having the at least one through hole; and at least one land extending on at least one surface of the substrate, and the at least one land extending adjacent to an opening of the at least one through hole, and wherein a projecting length of the at least one lead from the at least one surface of the substrate is not greater than one half of a horizontal size of the at least one land, where the projecting length is defined to be a length of a projecting part of the at least one lead, which projects from the at least one surface of the substrate, and the land is in contact with a flat fillet of the lead-less solder.

It is also possible that the projecting length is not greater than zero, and the at least one lead is free of any project part from the at least one surface of the substrate.

It is also possible that at least one coating layer is provided on a first surface of the substrate, and the first surface faces to the electronic part, and the at least one coating layer coats at least one part of an outer peripheral region of the at least one land, so that the at least one part of the outer peripheral region of the at least one land is separated from the lead-less solder, and that a second-side projecting length of the at least one lead from a second surface of the substrate is not greater than one half of a horizontal size of the at least one land on the second surface, where the second-side projecting length is defined to be a length of a projecting part of the at least one lead, which projects from the second surface of the substrate, and the land on the second surface of the substrate is in contact with a flat fillet of the lead-less solder.

It is also possible that the second-side projecting length is not greater than zero, and the at least one lead is free of any second-side project part from the second surface of the substrate.

It is also possible that the at least one coating layer is spatially separated from the electronic part.

It is also possible that the at least one coating layer is in contact with the electronic part.

It is also possible that at least one spacer is provided between the electronic part and a first surface of the substrate, and the first surface faces to the electronic part, so that the at least one part of the outer peripheral region of the at least one land is separated from the lead-less solder, and that a second-side projecting length of the at least one lead from a second surface of the substrate is not greater than one half of a horizontal size of the at least one land on the second surface, where the second-side projecting length is defined to be a length of a projecting part of the at least one lead, which projects from the second surface of the substrate, and the land on the second surface of the substrate is in contact with a flat fillet of the lead-less solder.

It is also possible that the second-side projecting length is not greater than zero, and the at least one lead is free of any second-side project part from the second surface of the substrate.

It is also possible that the at least one spacer coats the land on the first surface of the substrate.

It is also possible that the at least one spacer does not coat the land on the first surface of the substrate, and at least one coating layer is further provided on the first surface of the substrate, and the at least one coating layer coats at least one part of an outer peripheral region of the land on the first surface of the substrate.

It is also possible that the at least one coating layer coats both an entirety of the land on the first surface of the substrate and a first side opening of the at least one through hole.

It is also possible that the wiring board further includes:

a first conductive film extending on an inner wall of the at least one through hole, and the first conductive film being connected with the at least one land;

at least one circuit wiring extending on the at least one surface of the substrate, and the at least one circuit wiring being connected with a connecting part of an outer peripheral region of the at least one land; and at least one protection film covering the at least one circuit wiring.

It is also possible that a confronting surface of the electronic part is adjacent to the at least one protection film, and the confronting surface faces to a first surface of the substrate, and the land on the first surface of the substrate is in contact with at least one flat fillet of the lead-less solder.

A sixth aspect of the present invention is an electronic device comprising: a wiring board having at least one through hole; and an electronic part being mounted on the wiring board, and the electronic part having at least one lead being inserted into the at least one through hole and being bonded to the at least one through hole via a lead-less solder, and wherein the wiring board includes: a substrate having the at least one through hole; and at least one land extending on at least one surface of the substrate, and the at least one land extending adjacent to an opening of the at least one through hole, and wherein the at least one lead comprises: a first-side projecting portion which projects from a first surface of the substrate, and the first surface facing to the electronic part; and an insertion portion which is within the at least one through hole; and a second-side projecting portion which projects from a second surface of the substrate, and wherein at least an adjacent part of at least one of the first-side projecting portion and the second-side projecting portion is coated with a coating film which has a lower reactivity to the lead-less solder in a melt state than the at least one lead, and the adjacent part is adjacent to the insertion portion.

It is also possible that an entirety of each of the first-side projecting portion and the second-side projecting portion is coated with the coating film.

It is also possible that at least an adjacent part of each of the first-side projecting portion and the second-side projecting portion is coated with the coating film.

It is also possible that at least an adjacent part of the first-side projecting portion is coated with the coating film, and a second-side projecting length of the second-side projecting portion is not greater than one half of a horizontal size of the at least one land on the second surface, and the land on the second surface of the substrate is in contact with a flat fillet of the lead-less solder.

It is also possible that at least an adjacent part of the first-side projecting portion is coated with the coating film, and at least one coating layer is provided on a second surface of the substrate, and the at least one coating layer coats at least one part of an outer peripheral region of the land on the second surface of the substrate, so that the at least one part of the outer peripheral region of the land is separated from the lead-less solder.

It is also possible that at least an adjacent part of the second-side projecting portion is coated with the coating film, and at least one coating layer is provided on a first surface of the substrate, and the at least one coating layer coats at least one part of an outer peripheral region of the land on the first surface of the substrate, so that the at least one part of the outer peripheral region of the land is separated from the lead-less solder.

It is also possible that the wiring board further includes:

a first conductive film extending on an inner wall of the at least one through hole, and the first conductive film being connected with the at least one land;

at least one circuit wiring extending on the at least one surface of the substrate, and the at least one circuit wiring being connected with a connecting part of an outer peripheral region of the at least one land; and at least one protection film covering the at least one circuit wiring.

A seventh aspect of the present invention is a method of mounting an electronic part having at least one lead onto a wiring board having at least one through hole for allowing an insertion of the at least one lead. The method includes the steps of:

forming at least one coating film which coats at least one of an outer peripheral region of at least one land on at least one surface of a substrate of the wiring board;

placing the electronic part onto the wiring board, so that the at least one lead inserts into the at least one through hole; and bonding the at least one lead to the at least one through hole by a soldering process using a lead-less solder, wherein the at least one of the outer peripheral region of the at least one land is separated by the at least one coating film from the lead-less solder.

An eighth aspect of the present invention is a method of mounting an electronic part having at least one lead onto a wiring, board having at least one through hole for allowing an insertion of the at least one lead. The method includes the steps of:

forming at least one spacer on a first surface of the substrate of the wiring board;

placing the electronic part onto the at least one spacer, so that the at least one lead inserts into the at least one through hole, wherein a second-side projecting length of a second-side projecting portion of the at least one lead from a second surface of the substrate is not greater than one half of a horizontal size of the at least one land on the second surface, where the second-side projecting length is defined to be a length of the second-side projecting portion, which projects from the second surface of the substrate; and bonding the at least one lead to the at least one through hole by a soldering process using a lead-less solder, wherein the at least one land is in contact with a flat fillet of the lead-less solder.

A ninth aspect of the present invention is a method of mounting an electronic part having at least one lead onto a wiring board having at least one through hole for allowing an insertion of the at least one lead. The method includes the steps of:

shortening an original length of the at least one lead of the electronic part to form at least one length-shortened lead of the electronic part;

placing the electronic part onto the at least one spacer, so that the at least one length-shortened lead inserts into the at least one through hole, wherein a second-side projecting length of a second-side projecting portion of the at least one length-shortened lead from a second surface of the substrate is not greater than one half of a horizontal size of the at least one land on the second surface, where the second-side projecting length is defined to be a length of the second-side projecting portion, which projects from the second surface of the substrate; and bonding the at least one lead to the at least one through hole by a soldering process using a lead-less solder, wherein the at least one land on the second surface is in contact with a flat fillet of the lead-less solder.

A tenth aspect of the present invention is a method of mounting an electronic part having at least one lead onto a wiring board having at least one through hole for allowing an insertion of the at least one lead. The method includes the steps of:

forming at least one coating layer on a first surface of the substrate of the wiring board;

placing the electronic part onto the at least one coating layer, so that the at least one lead inserts into the at least one through hole, wherein a second-side projecting length of a second-side projecting portion of the at least one lead from a second surface of the substrate is not greater than one half of a horizontal size of the at least one land on the second surface, where the second-side projecting length is defined to be a length of the second-side projecting portion, which projects from the second surface of the substrate; and bonding the at least one lead to the at least one through hole by a soldering process using a lead-less solder, wherein the at least one land is in contact with a flat fillet of the lead-less solder.

An eleventh aspect of the present invention is a method of mounting an electronic part having at least one lead onto a wiring board having at least one through hole for allowing an insertion of the at least one lead. The method includes the steps of:

forming at least one coating film which coats at least an adjacent part of at least one of a first-side projecting part and a second-side projecting part of the at least one lead, wherein the at least one coating film has a lower reactivity to a lead-less solder in a melt state than the at least one lead;

placing the electronic part over the first surface of the substrate, so that the at least one lead inserts into the at least one through hole, and an insertion region of the at least one lead is in the at least one through hole, and the first-side projecting part projects from a first surface of a substrate of the wiring board, and the second-side projecting part projects from a second surface of the substrate; and bonding the at least one lead to the at least one through hole by a soldering process using a lead-less solder, wherein the insertion region of the at least one lead is in contact with the lead-less solder, and no fillet is formed on the at least one coating film.

The following embodiments are typical examples for practicing the foregoing aspects of the present invention. Although the subject matters of the present invention have been described in details, the following additional descriptions in one or more typical preferred embodiments or examples will be made with reference to the drawings for making it easy to understand the typical modes for practicing the foregoing aspects of the present invention.

Figure 6:
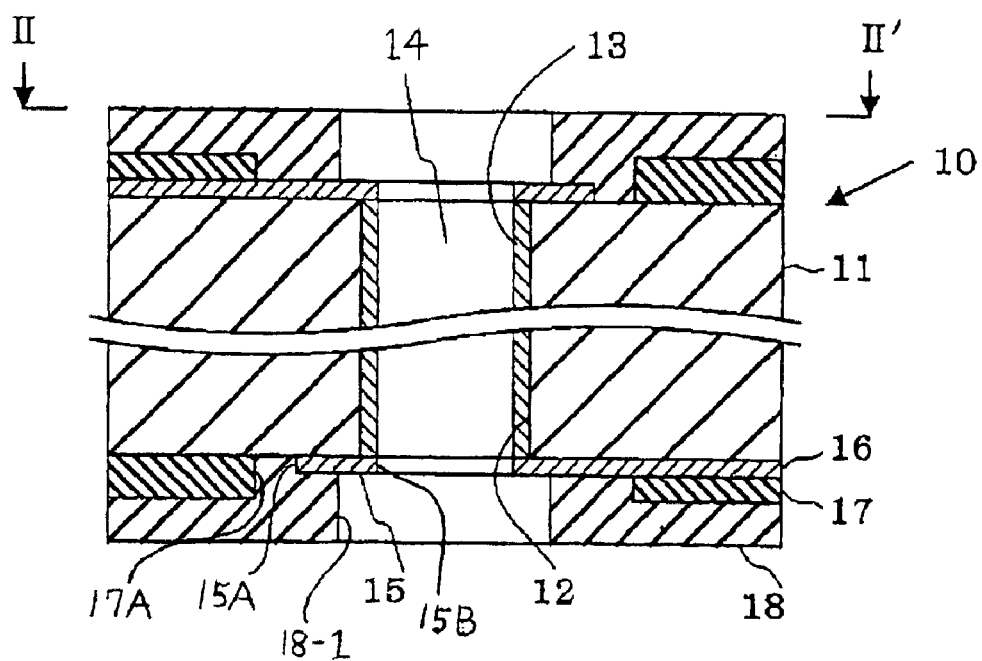
FIG. 6 is a fragmentary cross sectional elevation view of a first novel structure of a wiring board with through holes for mounting an electronic part thereon in a first embodiment in accordance with the present invention.
Figure 7:
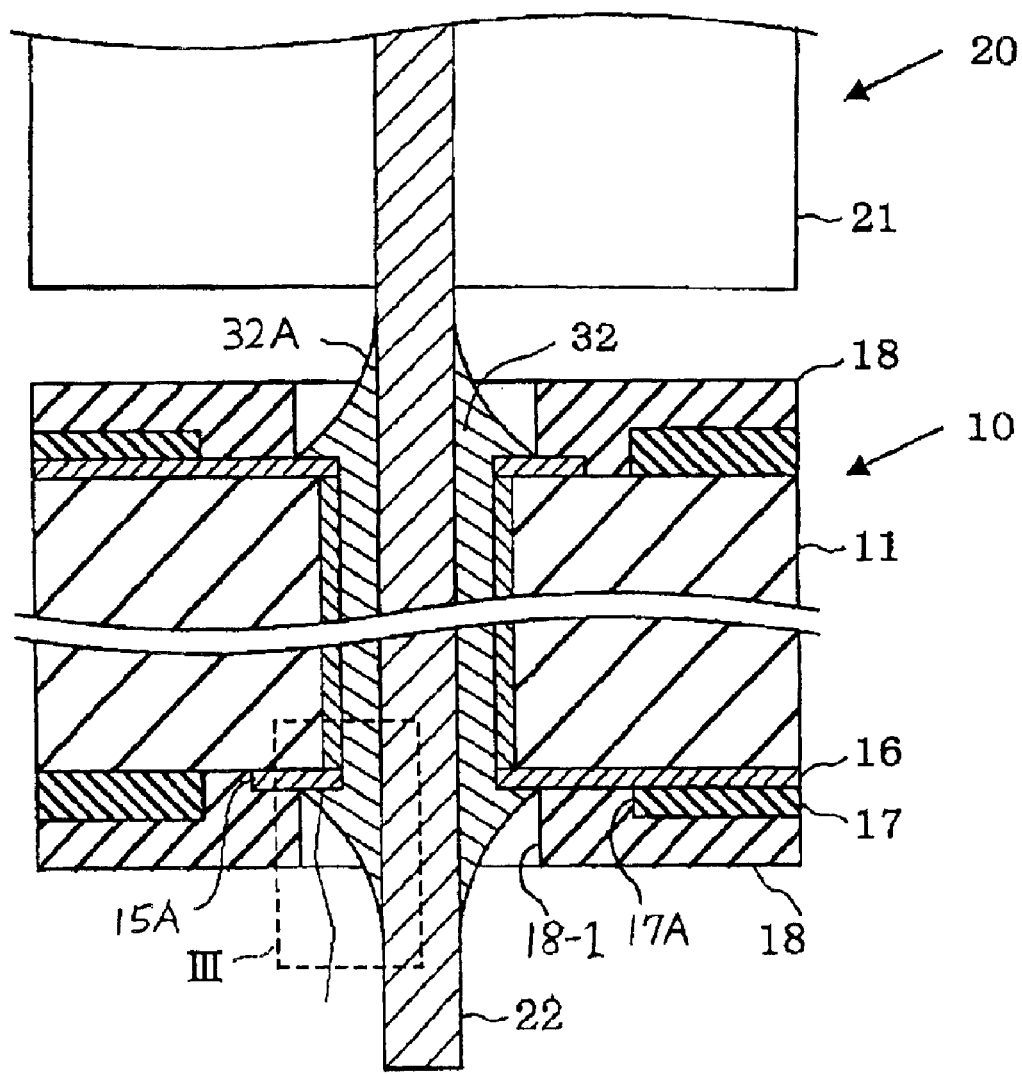
FIG. 7 is a fragmentary cross sectional elevation view of the first novel structure of the wiring board, on which the electronic part is mounted via the through holes in the first embodiment in accordance with the present invention.
Figure 8:
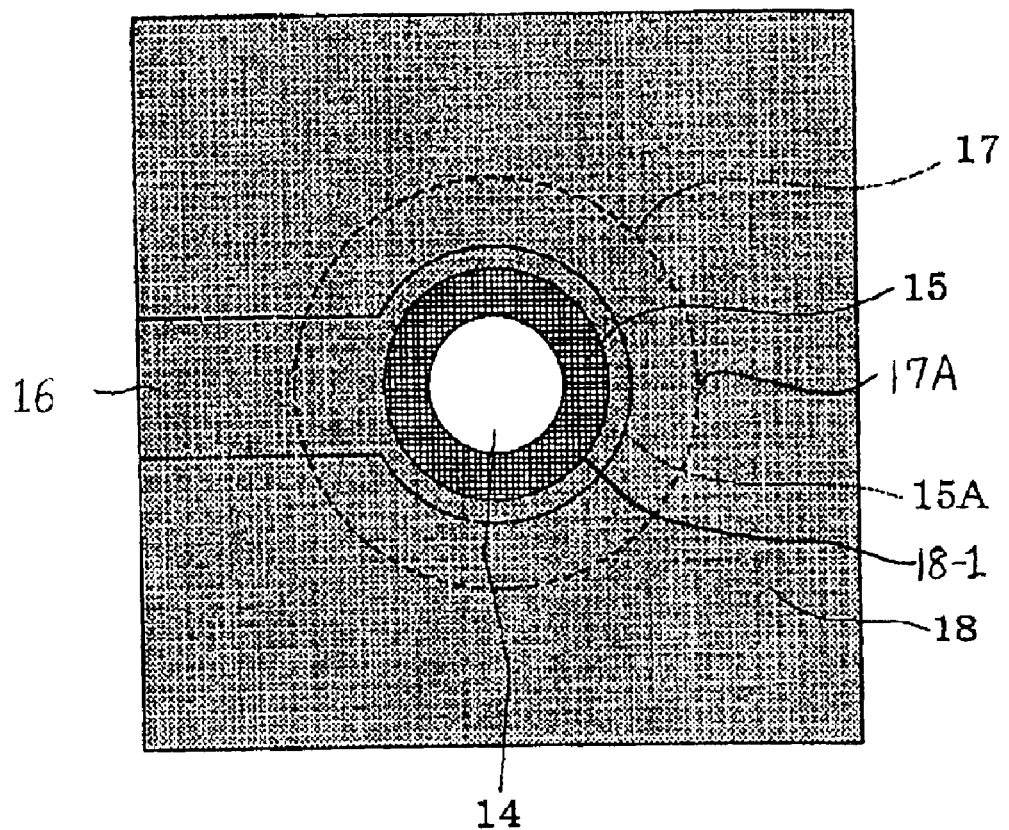
FIG. 8 is a fragmentary plan view from a line II–II' of the first novel structure of the wiring board shown in FIG. 6.
Figure 9:
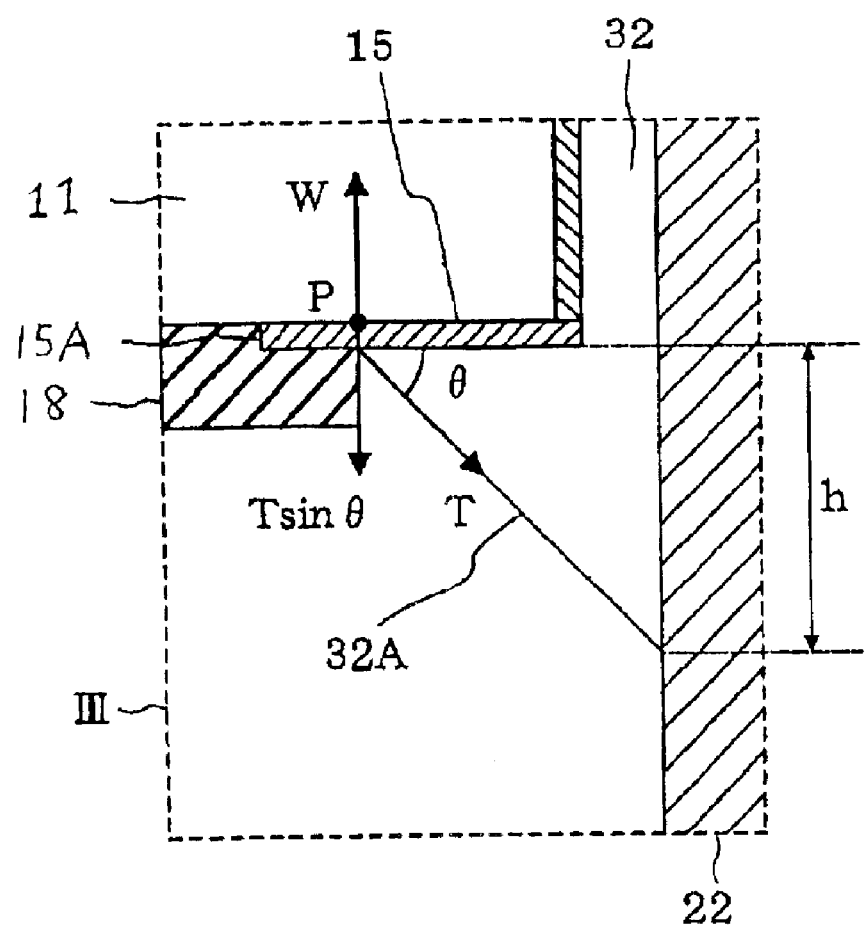
FIG. 9 is a fragmentary enlarged cross sectional elevation view, encompassed in a rectangle shape by a broken line III, illustrative of a mechanism of causing the peel of the land of the wiring board shown in FIG. 7.

First Embodiment:

A first embodiment according to the present invention will be described in detail with reference to the drawings. FIG. 6 is a fragmentary cross sectional elevation view of a first novel structure of a wiring board with through holes for mounting an electronic part thereon in a first embodiment in accordance with the present invention. FIG. 7 is a fragmentary cross sectional elevation view of the first novel structure of the wiring board, on which the electronic part is mounted via the through holes in the first embodiment in accordance with the present invention. FIG. 8 is a fragmentary plan view from a line II–II' of the first novel structure of the wiring board shown in FIG. 6. FIG. 9 is a fragmentary enlarged cross sectional elevation view, encompassed in a rectangle shape by a broken line III, illustrative of a mechanism of causing the peel of the land of the wiring board shown in FIG. 7.

As shown in FIGS. 6, 7 and 8, a body of a wiring board 10 comprises a copper-clad lamination substrate 11. This copper-clad lamination substrate 11 comprises an insulating sheet having surfaces coated with copper foils. The insulating sheet may comprise an insulating base material, into which a resin material is infiltrated. Typical examples of the insulating base material may include, but not limited to, paper base materials, glass base materials and a polyester fiber base material. Typical examples of the resin material, to be infiltrated into the insulating base material, may include, but not limited to, an epoxy resin and a phenol resin.

The copper-clad lamination substrate 11 includes at lest a through hole 12. A typical example of shape of the through hole 12 may include, but not limited to, a cylinder shape. An inner wall of the through hole 12 is coated with an electrically conductive film 13 which is further connected or communicated with the copper foils on the surfaces of the copper-clad lamination substrate 11. This electrically conductive film 13 may be formed as follows. A catalyst is applied onto the inner wall of the through hole 12, before an electroless-copper-plating is taken place to form a base copper-plated layer on the inner wall of the through hole 12. Subsequently, an electro-copper-plating is taken place to form a copper-plated layer on the base copper-plated layer, thereby to form the electrically conductive film 13 on the inner wall of the through hole 12. The through hole 12 with the inner wall coated with the electrically conductive film 13 will, hereinafter, be referred to as a through hole 14.

Each of the copper foils on the opposite surfaces of the copper-clad lamination substrate 11 is selectively removed or etched, so that the remaining copper foil on each of the surfaces of the copper-clad lamination substrate 11 comprises a land 15 extending around the through hole 14 and a circuit wiring 16 which are connected with the land 15. A typical plan shape of the land 15 is a ring shape, provided that the through hole 14 has a cylinder shape. Typically, the land 15 and the circuit wiring 16 are formed on each of the opposite surfaces of the copper-clad lamination substrate 11. It may optionally be possible that the land 15 and the circuit wiring 16 are formed on only one surface of the copper-clad lamination substrate 11. The land 15 is preferably small as realizing a high density packaging as possible, as long as a minimum necessary bonding strength is ensured.

The opposite surfaces of the copper-clad lamination substrate 11 are covered by solder resist layers 17, except for the lands 15 and peripheral portions thereof, so that an inner periphery 17A of the solder resist film 17 is separated or distanced by a small gap from an outer periphery 15A of the land 15. Namely, the inner periphery 17A of the solder resist film 17 encompasses the outer periphery 15A of the land 15.

The circuit wiring 16 on each of the opposite surfaces of the copper-clad lamination substrate 11 are covered by the solder resist layer 17. The solder resist layer 17 may be formed by printing a paste on the each surface of the copper-clad lamination substrate 11 and subsequent exposure to a light.

In each side of the wiring board 10, a coating layer 18 is further provided, which extends on the solder resist layer 17 and an outer peripheral region of the land 15, as well as on a boundary between the circuit wiring 16 and the land 15, and further extends to fill the gap between the inner periphery 17A of the solder resist film 17 and the outer periphery 15A of the land 15. The coating layer 18 extends entirely except for the inside of the outer peripheral region of the land 15. The outer peripheral region of the land 15 is covered by an inner peripheral region of the coating layer 18.

In the plan view, an inner periphery 18-1 of the coating layer 18 encompasses the through hole 14 or an inner periphery 15B of the land 15, while the inner periphery 18-1 of the coating layer 18 is encompassed by the outer periphery 15A of the land 15. Namely, the inner periphery 18-1 of the coating layer 18 is positioned between the side wall of the through hole 14 or the inner periphery 15B of the land 15 and the outer periphery 15A of the land 15. In other words, the coating layer 18 has a circle-shaped opening defined by the inner periphery 18-1. A diameter of the circle-shaped opening of the coating layer 18 is smaller than another diameter of the outer periphery 15A of the land 15 and larger than still another diameter of the through hole 14 or of the inner periphery 15B of the land 15.

The object of further providing the coating layer 18 is to suppress the land 15 from being peeled or floated from the surface of the copper-clad lamination substrate 11. In this embodiment, the coating layer 18 overlies omnidirectionally all of the outer peripheral region of the land 15. Notwithstanding, it is also possible as a modification that the coating layer 18 overlies at least a part of the outer peripheral region of the land 15, as long as the presence of the overlying part of the coating layer 18 contributes to suppress the land 15 from being peeled or floated from the surface of the copper-clad lamination substrate 11.

The coating layer 18 may comprise any thermally stable material to a heat generated by a soldering process. Namely, any materials are available to the coating layer 18, as long as the materials are stable to a melting point of a used lead-less solder 32. If the lead-less solder 32 contains Sn, Ag and Cu, then the melting point thereof is ranged from 216° C.–217° C. In this case, typical examples of the available material for the coating layer 18 may include, but not limited to, metals such as nickel, thermally stable resins such as epoxy resin, and thermally stable silicone rubbers. Typical examples of the wiring board 10 may include, but not limited to, any types of the wiring boards such as a double-sided board and a multilayer wiring board.

An electric part 20 is mounted on the wiring board 10. The electric part 20 has a body 21 and a plurality of leads 22, one of which is shown in FIG. 7. The lead 22 is inserted into the through hole 14 of the wiring board 10, so that the lead 22 completely penetrates the through hole 14, whereby a top of the lead 22 projects from the opposite surface positioned in the opposite side to the electric part 20. The lead 22 is bonded to the through hole 14 via the lead-less solder 32. In the soldering process, the melt lead-less solder 32 fills a gap between the lead 22 and the through hole 14 and further extends on the land 15, except for the outer peripheral region of the land 15, because an outward flow of the melt lead-less solder 32 is blocked or stopped by the inner periphery 18-1 of the coating layer 18, whereby a base portion of each of a fillet 32A of the lead-less solder 32 is defined by the inner periphery 18-1 of the coating layer 18. Namely, the lead-less solder 32 is in contact with the land 15, except for the outer peripheral region of the land 15.

After the soldering process, the melt lead-less solder 32 is cooled and shows a solidifying shrinkage. As shown in FIG. 9, the solidifying shrinkage of the lead-less solder 32 applies a force or a tension to the land 15. For example, a position "P" of the land 15, which is aligned to the inner periphery 18-1 of the coating layer 18, is applied with a tension "T" which is directed along a slope direction of the base portion of the fillet 32A of the lead-less solder 32, wherein the slope direction has an included angle "θ" to the surface of the land 15. The tension "T" has a vertical component "T sin θ" which is vertical to the surface of the land 15. The vertical component "T sin θ" of the applied tension "T" to the land 15 opposes to an adhesion force "W" effective for adhering or securing the land 15 to the surface of the copper-clad lamination substrate 11. The vertical component "T sin θ" may be considered to be a peeling force to peel the land 15 from the surface of the copper-clad lamination substrate 11. The adhesion force "W" is opposed to the peeling force "T sin θ".

The peel of the land 15 is caused if the peeling force "T sin θ" is larger than the adhesion force "W". The adhesion force "W" becomes weaken as the position becomes outwardly, and becomes stronger as the position becomes inwardly. The coating layer 18, which overlies the outer peripheral region of the land 15, blocks or defines the base portion of the fillet 32A of the lead-less solder 32. Namely, the fillet 32A is in contact with the land 15 except for the outer peripheral region thereof. This means that the land 15 receives the tension or the peeling force, except for the outer peripheral region thereof. In other words, the presence of the coating layer 18, which overlies the outer peripheral region of the land 15, ensures that the outer peripheral region of the land 15 is separated from the fillet 32A of the lead-less solder 32, whereby the outer peripheral region of the land 15 receives no tension from the solidifying shrinkage of the fillet 32A of the lead-less solder 32. The inside region of the land 15, which is inside of the outer peripheral region thereof, has larger adhesion forces than the peripheral region thereof. No application of the tension or the peeling force to the outer peripheral region of the land 15 having the weak adhesion force contributes to avoid that the adhesion force "W" of the inside land region is smaller than the peeling force "T sin θ" applied to the inside land region. This may suppress the land 15 from being peeled or floated from the surface of the copper-clad lamination substrate 11.

Further, the presence of the coating layer 18 overlying the outer peripheral region of the land 15 additionally contributes to suppress the land 15 from being peeled or floated from the surface of the copper-clad lamination substrate 11.

Furthermore, separation of the outer peripheral region of the land 15 from the fillet 32A of the lead-less solder 32 allows the land 15 to follow thermal expansion and contraction of the copper-clad lamination substrate 11. This furthermore contributes to avoid the land 15 from being peeled or floated from the surface of the copper-clad lamination substrate 11.

The provision of the above coating layer 18 is effective to prevent the land 15 from being peeled or floated from the surface of the copper-clad lamination substrate 11 in the process for mounting the electronic part 20 onto the wiring board 10 by use of the lead-less solder 32. This allows the electronic device to have a long life-time and a high reliability.

Figure 5:
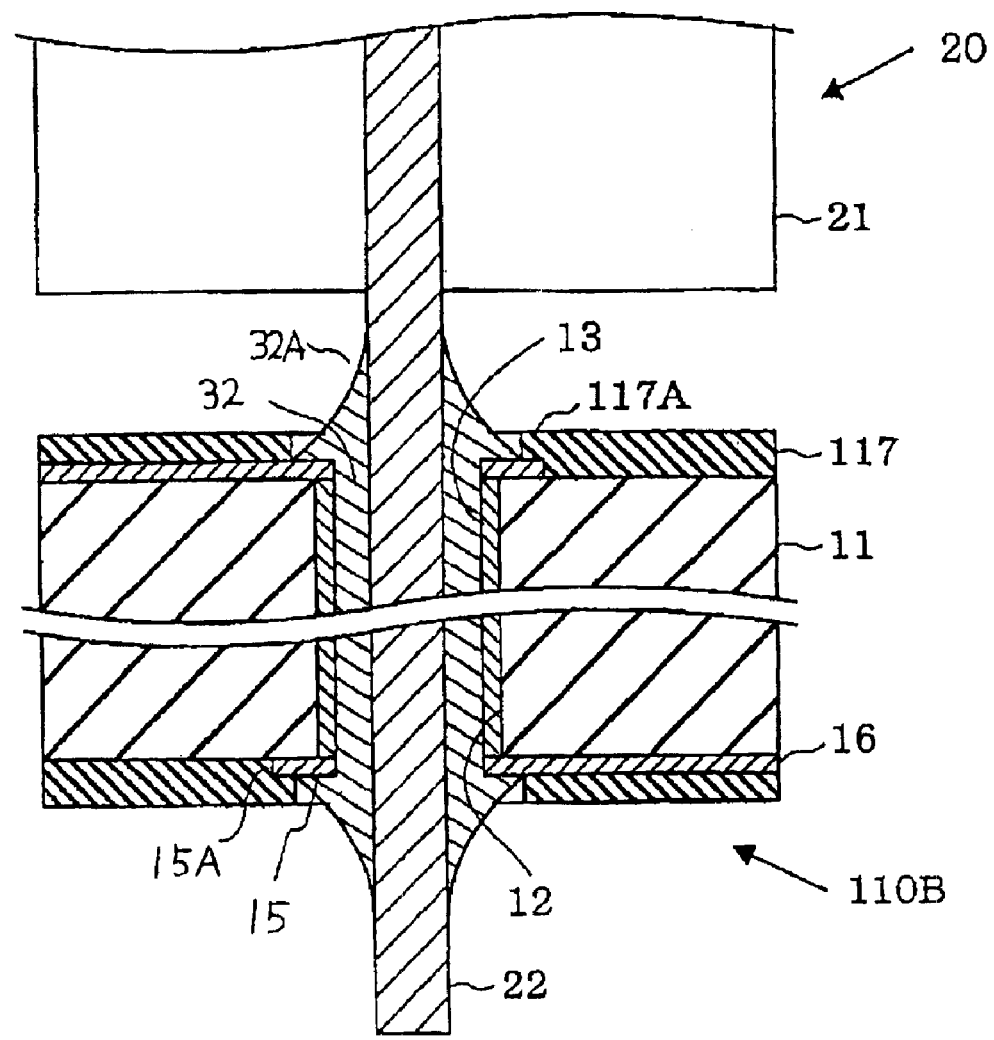
FIG. 5 is a fragmentary cross sectional elevation view of the second conventional structure of the wiring board, on which the electronic part is mounted via the through holes.

The manufacturing cost for the coating layer 18 is lower than the manufacturing cost for the above-described solder resist 117 shown in FIG. 5 The use of the coating layer 18 instead of the above-described solder resist 117 realizes suppression to the peel of the land 15 and allows the electronic device to have a long life-time and a high reliability at the low cost.

The above described technique for mounting the electronic part 20 onto the wiring board 10 in accordance with the present invention is applicable to not only the process for formation of the new product but also the other process for repairing the used product by changing the defective or failure electronic part to the new non-defective electronic part. In case that the defective or failure electronic part is mounted on the wiring board 110A free of the coating layer 18, then the coating layer 18 is provided on the wiring board 110A, before the new non-defective electronic part 20 is mounted onto the wiring board 110A with the coating layer 18 by use of the lead-less solder 32, there y preparing the electronic device by use of the lead-less solder 32 without disposal of the wiring board 110A.

As described above, in accordance with this embodiment, the coating layer 18 overlies omnidirectionally the entirety of the outer peripheral region of the land 15. Notwithstanding, it is possible as a modification that the coating layer 18 overlies at least a part of the outer peripheral region of the land 15, as long as the presence of the overlying part of the coating layer 18 contributes to suppress the land 15 from being peeled or floated from the surface of the copper-clad lamination substrate 11.

It is also possible as a further modification that the coating layer 18 overlies only one or more important parts of the land 15, for example, a boundary part or a connecting part of the outer peripheral region of the land 15 with the circuit wiring 16. If the coating layer 18 overlies only the boundary part of the outer peripheral region of the land 15 to the circuit wiring 16, then the coating layer 18 is still effective to suppress the peel of the boundary part of the outer peripheral region of the land 15 to the circuit wiring 16, thereby preventing a disconnection at the boundary between the land 15 and the circuit wiring 16.

It is also possible as a furthermore modification that the coating layer 18 overlies a diametrically opposite part to the boundary part of the outer peripheral region of the land 15 to the circuit wiring 16. If the coating layer 18 overlies only the diametrically opposite part to the boundary part of the outer peripheral region of the land 15 to the circuit wiring 16, then the coating layer 18 is still effective to suppress the peel of the land 15, similarly to the above case that the coating layer 18 overlies only the boundary part of the outer peripheral region of the land 15.

It is also possible as moreover modification that the coating layer 18 overlies both the boundary part of the outer peripheral region of the land 15 to the circuit wiring 16 and the diametrically opposite part to the boundary part. If the coating layer 18 overlies both the boundary part and the diametrically opposite part, then the coating layer 18 is still effective to suppress the peel of the land 15, similarly to the above case that the coating layer 18 overlies only the boundary part of the outer peripheral region of the land 15.

As shown in FIGS. 6, 7 and 8 and described above, in accordance with this embodiment of the present invention, the coating layer 18 overlies the outer peripheral region of the land 15, while the other region of the land 15 inside of the outer peripheral region thereof is not covered or overlain by the inner peripheral region of the coating layer 18, wherein the inner periphery 18-1 of the coating layer 18 encompasses the inner periphery 15B of the land 15, and is encompassed by the outer periphery 15A of the land 15.

Figure 10:
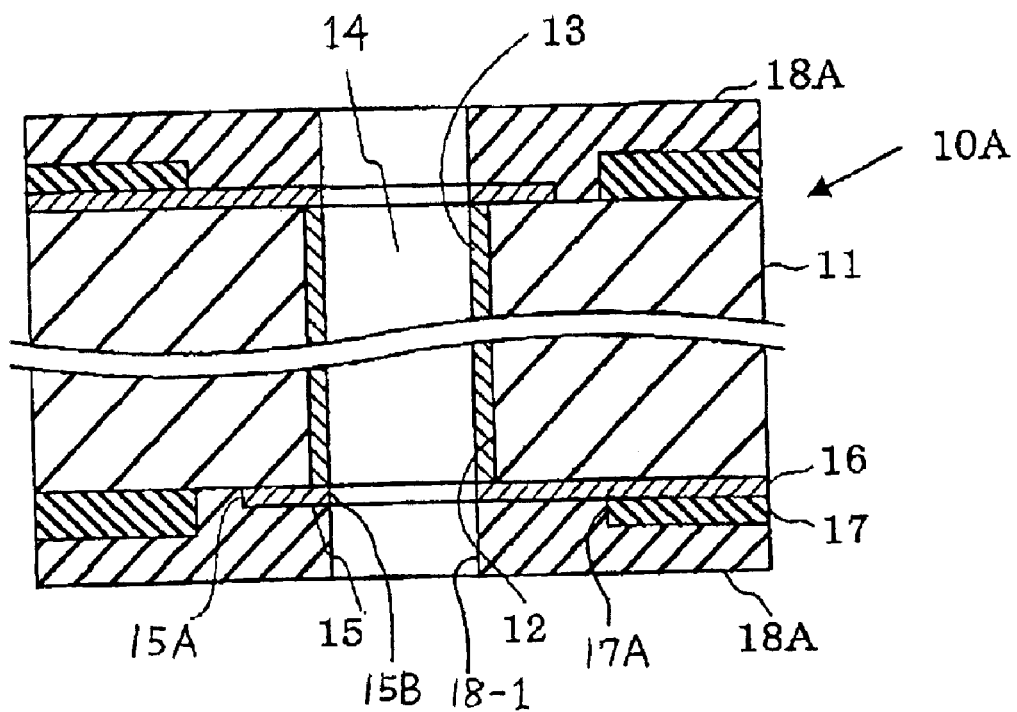
FIG. 10 is a fragmentary cross sectional elevation view of a first modification to the first novel structure of a wiring board with through holes for mounting an electronic part thereon in a first modification to the first embodiment in accordance with the present invention.
Figure 11:
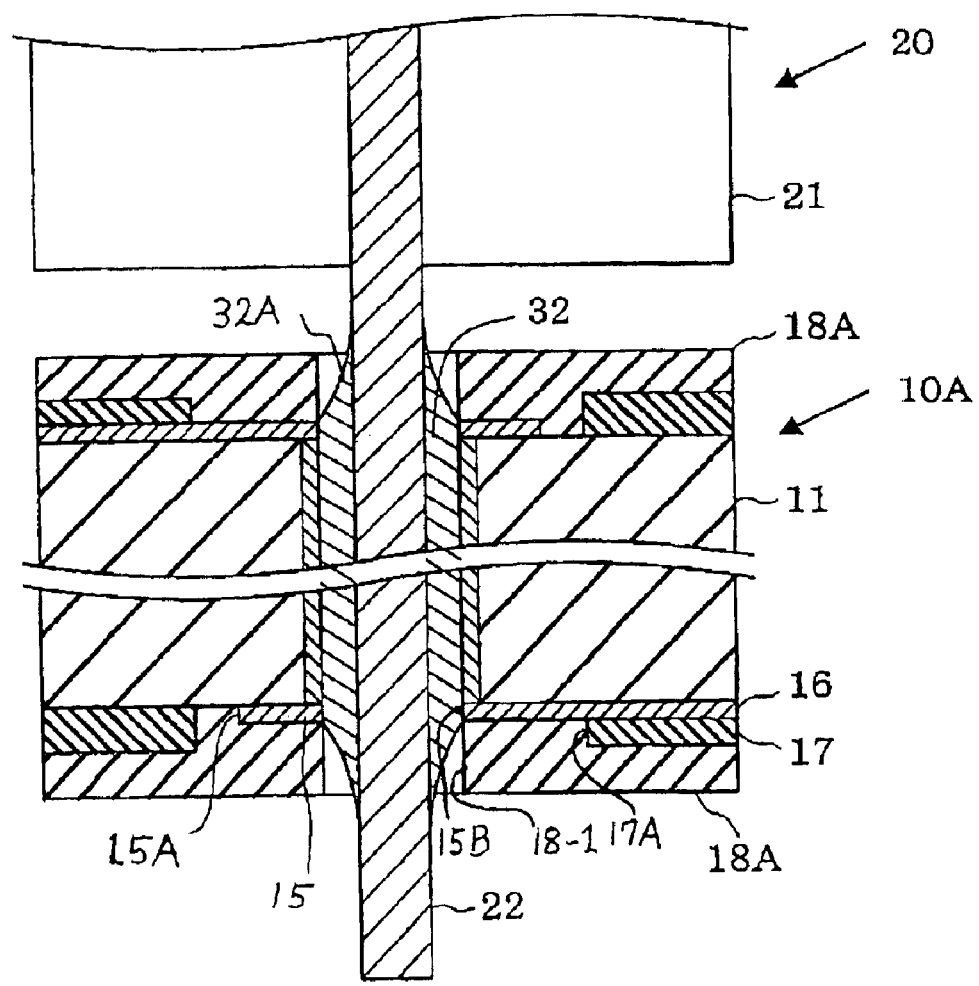
FIG. 11 is a fragmentary cross sectional elevation view of the first modification to the first novel structure of the wiring board, on which the electronic part is mounted via the through holes in the first modification to the first embodiment in accordance with the present invention.

It is also possible as still more modification that a wiring board 10A has a coating layer 18A which overlies omnidirectionally the entirety of the land 15 on each of the opposite surfaces of the copper-clad lamination substrate 11. FIG. 10 is a fragmentary cross sectional elevation view of a first modification to the first novel structure of a wiring board with through holes for mounting an electronic part thereon in a first modification to the first embodiment in accordance with the present invention. FIG. 11 is a fragmentary cross sectional elevation view of the first modification to the first novel structure of the wiring board, on which the electronic part is mounted via the through holes in the first modification to the first embodiment in accordance with the present invention. A modified wiring board 10A has the copper-clad lamination substrate 11. In each of the opposite surfaces of the copper-clad lamination substrate 11, the coating layer 18 overlies omnidirectionally the entirety of the land 15, wherein the inner periphery 18-1 of the coating layer 18A is just aligned to the inner periphery 15B of the land 15, whereby no region of the land 15 is in contact with the fillet 32A of the lead-less solder 32.

The presence of the coating layer 18A with the inner periphery 18-1 just aligned to the inner periphery 15B of the land 15 ensures that the entirety of the land 15 is separated from the fillet 32A of the lead-less solder 32, whereby the land 15 receives no tension from the fillet 32A when the lead-less solder 32 shows the solidifying shrinkage after the soldering process for mounting the electronic part 20 onto the wiring board 10A. No tension applied to the land 15 ensures prevention to the peel of the land 15 from the surface of the copper-clad lamination substrate 11.

Figure 12:
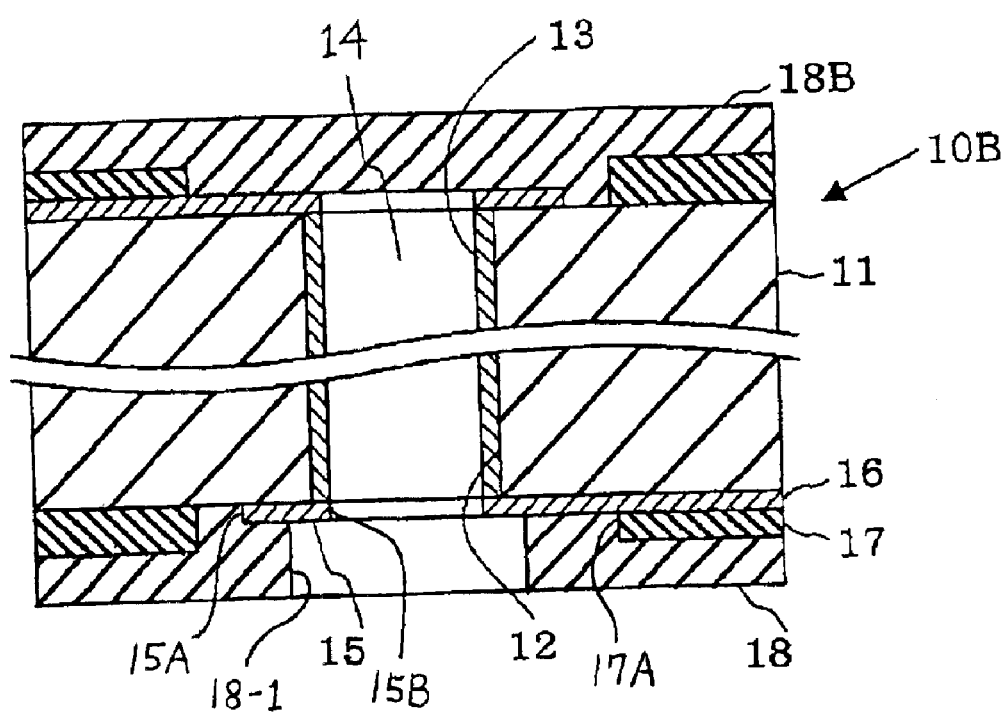
FIG. 12 is a fragmentary cross sectional elevation view of a second modification to the first novel structure of a wiring board with through holes for mounting an electronic part thereon in a second modification to the first embodiment in accordance with the present invention.
Figure 13:
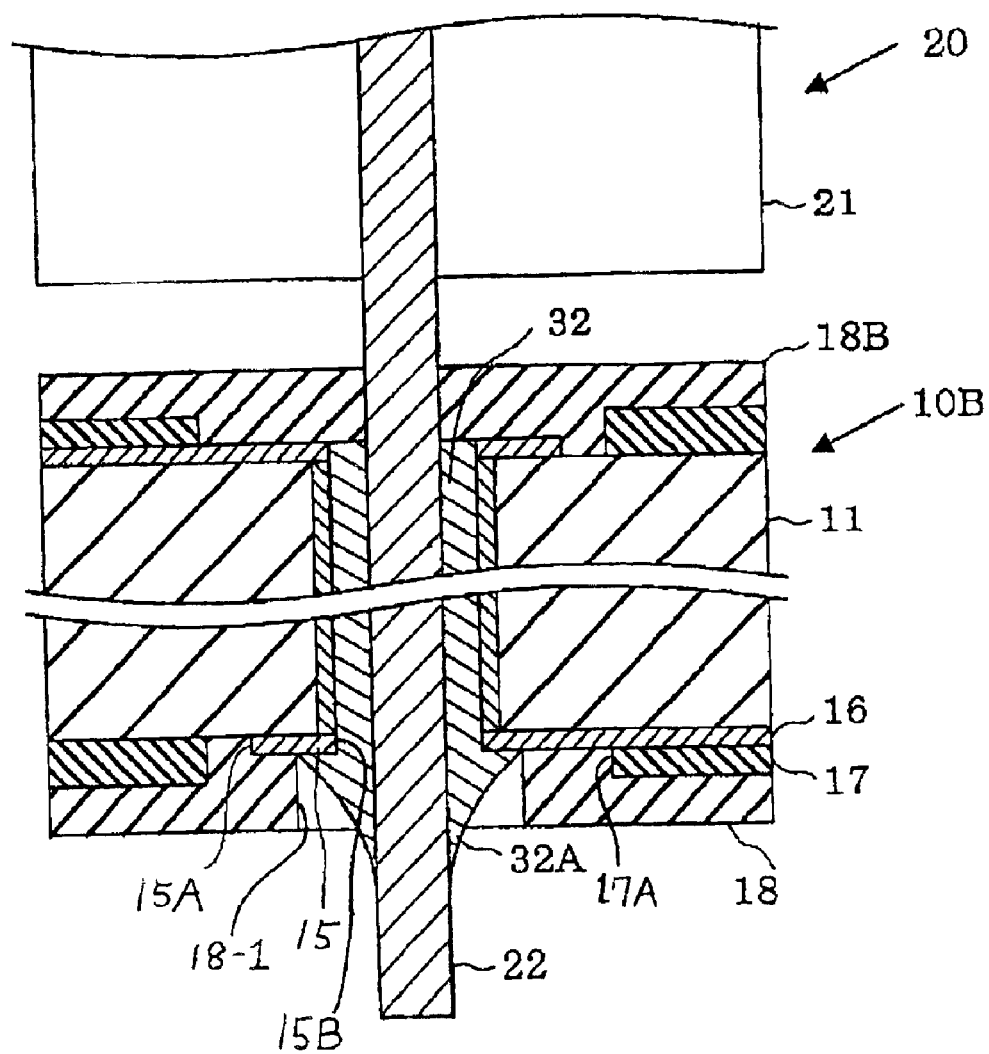
FIG. 13 is a fragmentary cross sectional elevation view of the second modification to the first novel structure of the wiring board, on which the electronic part is mounted via the through holes in the second modification to the first embodiment in accordance with the present invention.

It is also possible as yet more modification that a wiring board 10B has a coating layer 18A which overlies the entirety of a first surface of the copper-clad lamination substrate 11 and the coating layer 18 which overlies the solder resist 17 and the outer peripheral region of the land 15 on the second surface of the copper-clad lamination substrate 11, wherein the first surface is closer to the electronic part 20 and the second surface is opposite to the first surface. FIG. 12 is a fragmentary cross sectional elevation view of a second modification to the first novel structure of a wiring board with through holes for mounting an electronic part thereon in a second modification to the first embodiment in accordance with the present invention. FIG. 13 is a fragmentary cross sectional elevation view of the second modification to the first novel structure of the wiring board, on which the electronic part is mounted via the through holes in the second modification to the first embodiment in accordance with the present invention. A modified wiring board 10B has: the copper-clad lamination substrate 11. On the first surface, which is closer to the electronic part 20, of the copper-clad lamination substrate 11, the coating layer 18B has no opening and overlies the entirety of the first surface of the copper-clad lamination substrate 11, for example, not only the solder resist 17 but also the entirety of the land 15 and the through hole 14. Namely, on the first surface of the copper-clad lamination substrate 11, the through hole 14 is blocked or closed by the coating layer 18B.

On the second surface opposite to the first surface of the copper-clad lamination substrate 11, the coating layer 18 overlies the solder resist 17 and the outer peripheral region of the land 15. The coating layer 18 over the second surface shown in FIGS. 12 and 13 and described in this second modification to the first embodiment is the same as the coating layer 18 shown in FIGS. 6 and 7 and described in the first embodiment. The coating layer 18 has a circle-shaped opening. The inner periphery 18-1 of the coating layer 18 encompasses the inner periphery 15B of the land 15, while the inner periphery 18-1 of the coating layer 18 is encompassed by the outer periphery 15A of the land 15.

On the first surface closer to the electronic part 20, the presence of the coating layer 18B, which overlies the through hole 14 and the entirety of the land 15, ensures that the entirety of the land 15 is separated from the lead-less solder 32, whereby the land 15 receives no tension from the lead-less solder 32 when the lead-less solder 32 shows the solidifying shrinkage after the soldering process for mounting the electronic part 20 onto the wiring board 10A. No tension applied to the land 15 ensures prevention to the peel of the land 15 from the surface of the copper-clad lamination substrate 11.

On the second surface opposite to the first surface, the presence of the coating layer 18, which overlies the outer peripheral region of the land 15, ensures that the outer peripheral region of the land 15 is separated from the fillet 32A of the lead-less solder 32, whereby the outer peripheral region of the land 15 receives no tension from the solidifying shrinkage of the fillet 32A of the lead-less solder 32. The inside region of the land 15, which is inside of the outer peripheral region thereof, has larger adhesion forces than the peripheral region thereof. No application of the tension or the peeling force to the outer peripheral region of the land 15 having the weak adhesion force contributes to avoid that the adhesion force "W" of the inside land region is smaller than the peeling force "T sin θ" applied to the inside land region. This may suppress the land 15 from being peeled or floated from the surface of the copper-clad lamination substrate 11.

As shown in FIG. 13, for mounting the electronic part 20 onto the wiring board 10B, it is necessary that the leads 22 penetrate through the coating layer 18B on the first surface of the copper-clad lamination substrate 11, and inserts into the through hole 14. For this reason, it is preferable that the coating layer 18B is made of a material which makes it relatively easy to allow the leads 22 to punch and penetrate the coating layer 18B, and insert into the through hole 14, before the soldering process can be taken place, whereby no fillet is formed on the first surface of the copper-clad lamination substrate 11.

Figure 14:
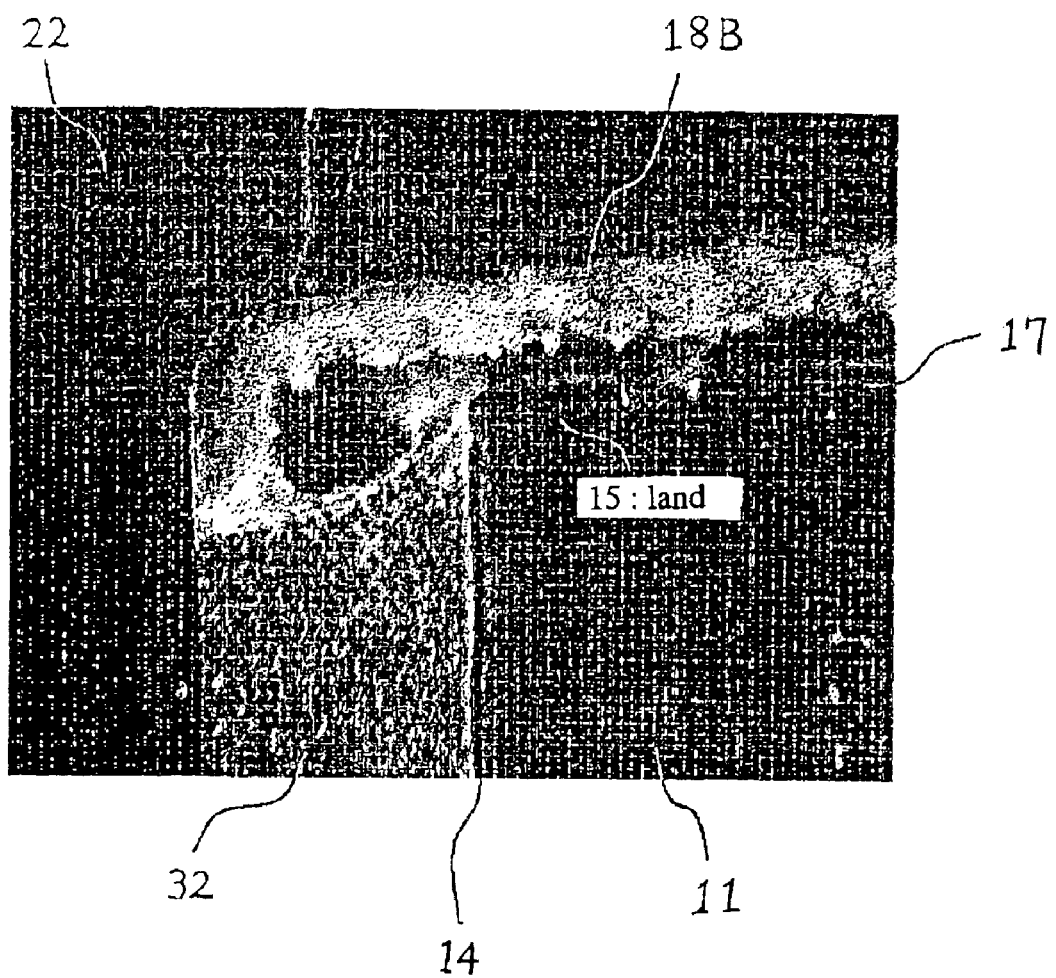
FIG. 14 is a photograph showing that the land isolated by the coating layer from the lead-less solder is free of any peel from the surface of the copper-clad lamination substrate in the second modification to the first embodiment in accordance with the present invention.

An investigation on the reliability of the electronic device, wherein the electronic part 20 is mounted on the wiring board 10B via the lead-less solder 32, was taken place. FIG. 14 is a photograph showing that the land 15 isolated from the lead-less solder 32 by the coating layer 18B on the first surface of the copper-clad lamination substrate 11 is free of any peel from the surface of the copper-clad lamination substrate 11, after the temperature cyclic test has been carried out. After the soldering process by use of the lead-less solder 32 is taken place to mount the electronic part 20 onto the wiring board 10B, then 200 cycles of heating and cooling processes are taken place as a temperature cyclic test in order to apply a thermal stress to the wiring board 10B under the same conditions of the above-described temperature cyclic test to the above described conventional wiring board 110A. As shown in FIG. 14, the land 15 is separated from the lead-less solder 32, and is in contact with or covered by the coating layer 18B entirely. No peel of the land 15 was observed. It was confirmed and demonstrated that the coating layer 18B, which overlies the solder resist 17 and the entirety of the land 15 as well as the through hole 14, is effective to ensure the prevention of the land 15 from the peel.

As shown in FIG. 13, the coating layer 18B over the first surface of the copper-clad lamination substrate 11 blocks or seals the through hole 14 in one side of the first surface of the copper-clad lamination substrate 11. The soldering process uses a flux. The flux may be vaporized. Blocking or sealing the through hole 14 by the coating layer 18B makes it difficult to discharge the vaporized flux from the through hole 14. It is preferable to form a gap between the lead 22 and the coating layer 18, so that the gap allows the vaporized flux to be discharged from the through hole 14.

The above-decried coating layers 18, 18A and 18B may optionally be removed after the soldering process has been completed, so that the electronic device as the final product is free of any of the above-decried coating layers 18, 18A and 18B. Notwithstanding, the above-decried coating layers 18, 18A and 18B may, of course, remain in the electronic device as the final product.

In case that the coating layer 18 are used in the soldering process and then removed from the wiring board 10 after the soldering process shown in FIG. 7 in accordance with the first embodiment of the present invention, an outer periphery of the base portion of the fillet 32A of the lead-less solder 32 encompasses the inner periphery 15B of the land 15 and is encompassed by the outer periphery 15A of the land 15. Namely, the outer periphery of the base portion of the fillet 32A of the lead-less solder 32 is positioned outside of the inner periphery 15B of the land 15 and inside of the outer periphery 15A of the land 15.

In case that the coating layers 18A are used in the soldering process and then removed from the wiring board 10A after the soldering process shown in FIG. 11 in accordance with the first modification to the first embodiment of the present invention, an outer periphery of the base portion of the fillet 32A of the lead-less solder 32 is defined by the inner periphery 15B of the land 15. Namely, the outer periphery of the base portion of the fillet 32A of the lead-less solder 32 is aligned to the inner periphery 15B of the land 15.

In case that the coating layers 18 and 18B are used in the soldering process and then removed from the wiring board 10B after the soldering process shown in FIG. 13 in accordance with the second modification to the first embodiment of the present invention, in the first side of the first surface of the copper-clad lamination substrate 11, the lead-less solder 32 has no fillet and is confined within the through hole 14, wherein an exposed surface of the lead-less solder 32 levels to the land 15. In the second side of the second surface of the copper-clad lamination substrate 11, an outer periphery of the base portion of the fillet 32A of the lead-less solder 32 encompasses the inner periphery 15B of the land 15 and is encompassed by the outer periphery 15A of the land 15. Namely, the outer periphery of the base portion of the fillet 32A of the lead-less solder 32 is positioned outside of the inner periphery 15B of the land 15 and inside of the outer periphery 15A of the land 15.

The plan outer shape of the land 15 is optional and is not limited to one or more particular shapes. Typical examples of the plan outer shape of the land 15 may include, but not limited to, not only circle, but also an ellipse, polygons, cross-shapes, star-shapes, and deformations thereof.

A sectioned shape of the lead 22 in a plan vertical to a longitudinal direction of the lead 22 is optional and is not limited to one or more particular shapes. Typical examples of the sectioned shape of the lead 22 may include, but not limited to, not only circle, but also an ellipse, polygons, cross-shapes, star-shapes, and deformations thereof.

Figure 15:
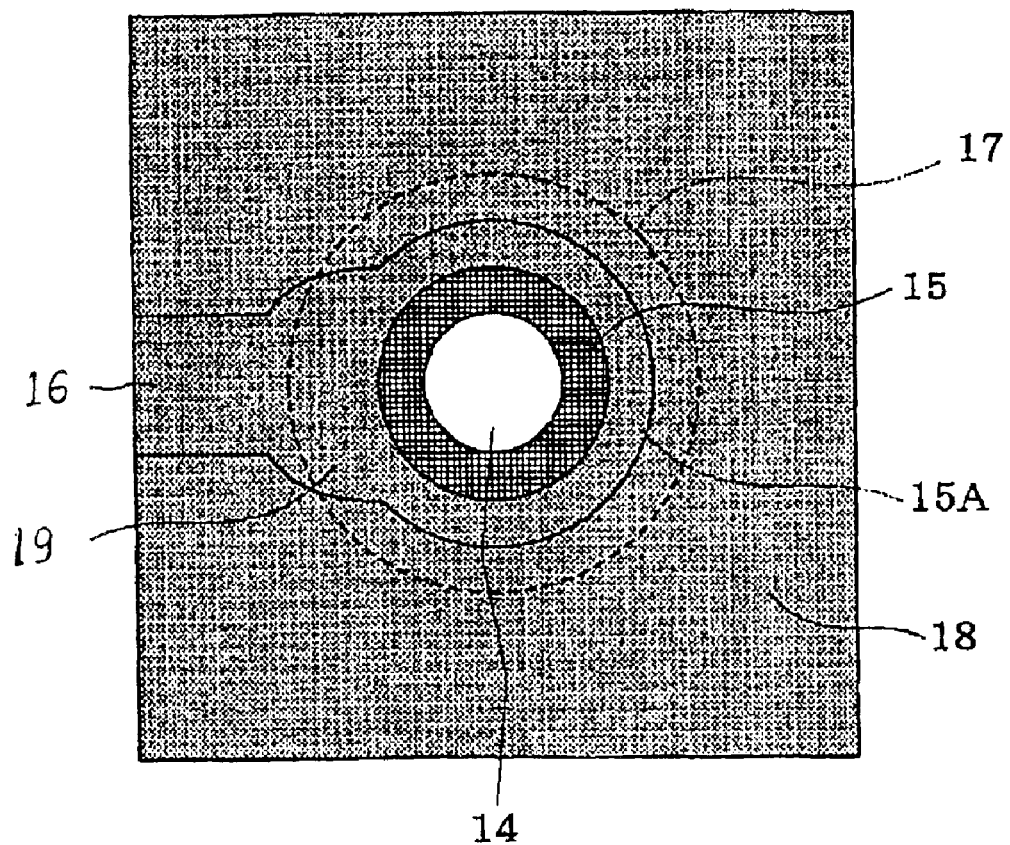
FIG. 15 is a fragmentary plane view of the land with an additional sub-land over one surface of the copper-clad lamination substrate in a third modification to the first embodiment in accordance with the present invention.

FIG. 15 is a fragmentary plane view of the land 15 with an additional sub-land 19 over one surface of the copper-clad lamination substrate 11 in a third modification to the first embodiment in accordance with the present invention. A sub-land 19 is provided at the boundary between the land 15 and the circuit wiring 16. Namely, the land 15 is communicated through the sub-land 19 to the circuit wiring 16. The sub-land 19 is larger in width than the circuit wiring 16, and smaller in width than the diameter of the land 15, so that the boundary region between the land 15 and the circuit wiring 16 is increased in width and in mechanical strength to avoid any disconnection at the boundary region. As one typical example, side peripheries of the sub-land 19 may be generally arched as shown in FIG. 15, even the shape of the sub-land 19 is optional as long as the boundary region between the land 15 and the circuit wiring 16 is increased in mechanical strength to avoid any disconnection at the boundary region.

It is also possible that the sub-land 19 is provided if the shape of the land 15 is not circle, wherein the shape of the sub-land 19 is not limited to the shape as shown in FIG. 15.

Typical examples of the lead-less solder 32 may include, but not limited to, tin-zinc-based solders, tin-silver-based solders, and tin-copper-based solders. One typical example of the compositions of the tin-zinc-based solders may be tin-zinc eutectic compositions, for example, Sn-9.0 wt % Zn. The content of zinc may vary and also one or more additional elements may be added. Another typical example is Sn-8.0 wt % Zn-3.0 wt % Bi.

One typical example of the compositions of the tin-silver-based solders may be tin-silver eutectic compositions, for example, Sn-3.5 wt % Ag. The content of silver may vary and also one or more additional elements may be added. Other typical examples are Sn-3.0 wt % Ag-0.5 wt % Cu, and Sn-3.5 wt % Ag-0.75 wt % Cu.

One typical example of the compositions of the tin-copper-based solders may be tin-copper eutectic compositions, for example, Sn-0.7 wt % Cu. The content of copper may vary and also one or more additional elements may be added. Another typical example is Sn-0.7 wt % Cu-0.3 wt % Ag. It is also possible to add a small amount of lead to the lead-less solder 32 as long as the property of the lead-less solder 32 is not substantially changed.

Figure 16:
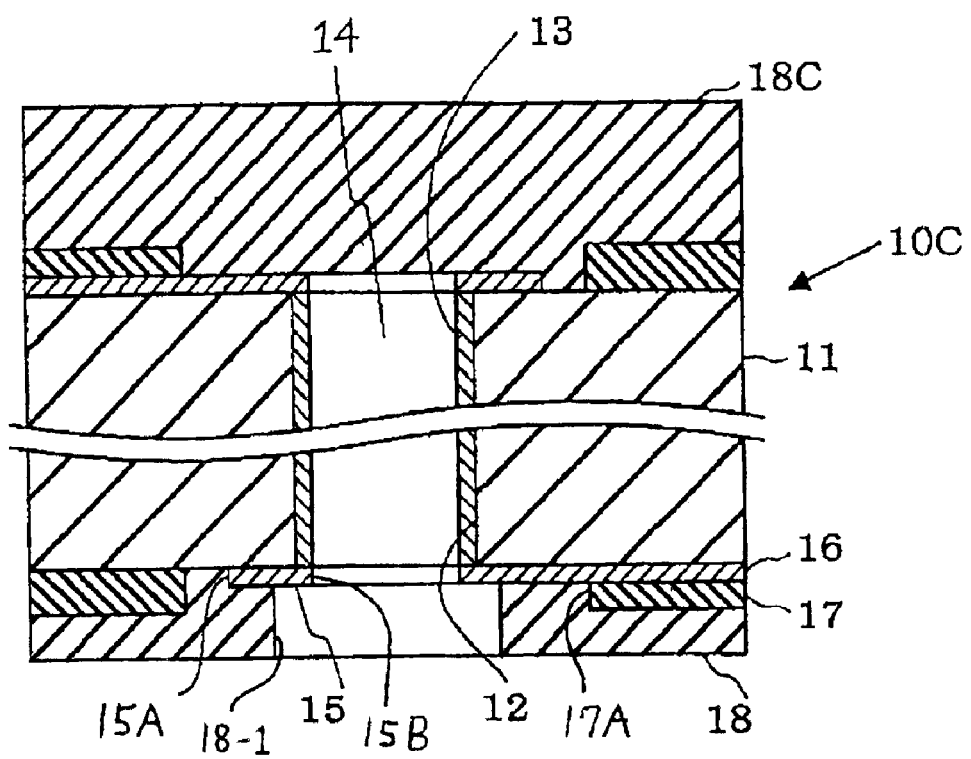
FIG. 16 is a fragmentary cross sectional elevation view of a second novel structure of a wiring board with through holes for mounting an electronic part thereon in a second embodiment in accordance with the present invention.
Figure 17:
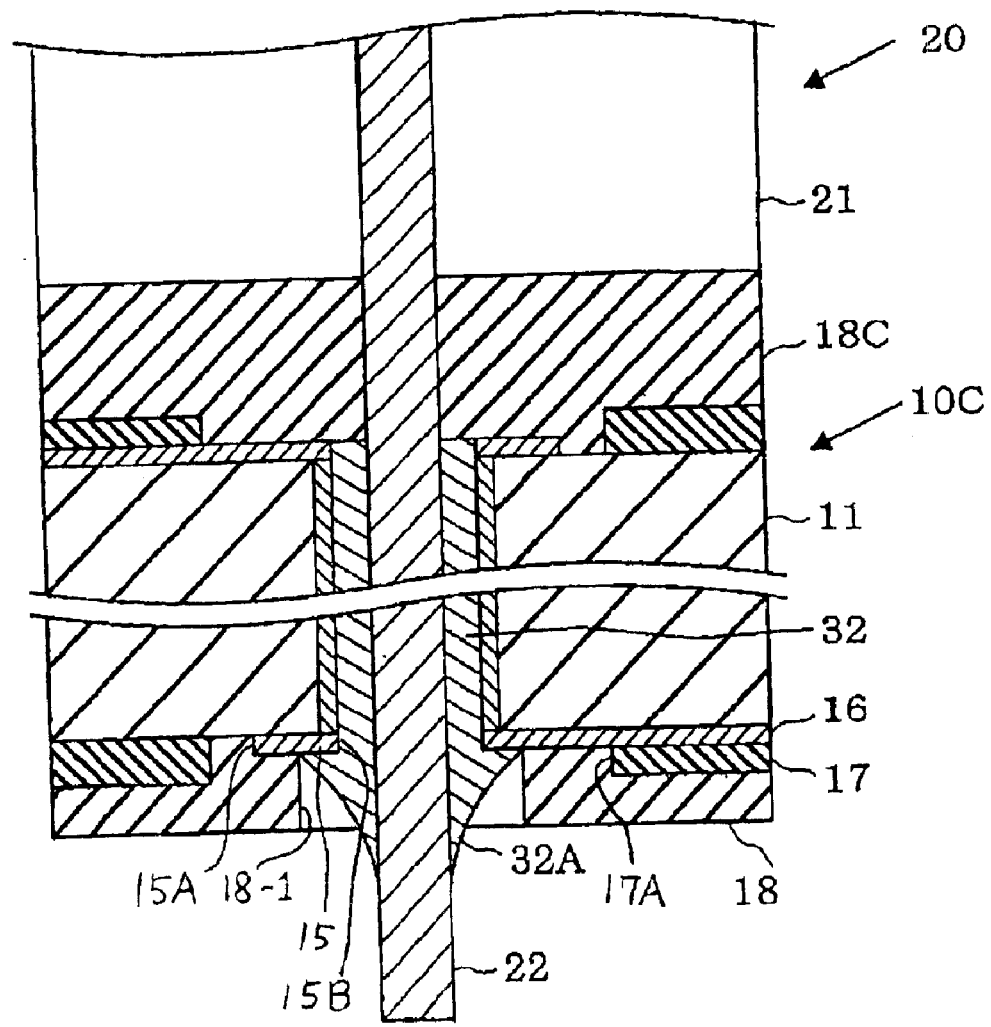
FIG. 17 is a fragmentary cross sectional elevation view of the second novel structure of the wiring board, on which the electronic part is mounted via the through holes in the second embodiment in accordance with the present invention.

Second Embodiment:

A second embodiment according to the present invention will be described in detail with reference to the drawings. FIG. 16 is a fragmentary cross sectional elevation view of a second novel structure of a wiring board with through holes for mounting an electronic part thereon in a second embodiment in accordance with the present invention. FIG. 17 is a fragmentary cross sectional elevation view of the second novel structure of the wiring board, on which the electronic part is mounted via the through holes in the second embodiment in accordance with the present invention.

As shown in FIGS. 16 and 17, a wiring board 10C of this embodiment is different only in a coating layer 18C from the above-described wiring board 10B of the second modification to the first embodiment in accordance with the present invention. The coating layer 18C has a thickness which is substantially the same as a gap or a distance between the first surface of the copper-clad lamination substrate 11 and the body 21 of the electronic part 20, so that the coating layer 18C fills the gap between the first surface of the copper-clad lamination substrate 11 and the body 21 of the electronic part 20.

On the first surface, which is closer to the electronic part 20, of the copper-clad lamination substrate 11, the coating layer 18C has no opening and overlies the entirety of the first surface of the copper-clad lamination substrate 11, for example, not only the solder resist 17 but also the entirety of the land 15 and the through hole 14. Namely, on the first surface of the copper-clad lamination substrate 11, the through hole 14 is blocked or closed by the coating layer 18B.

On the second surface opposite to the first surface of the copper-clad lamination substrate 11, the coating layer 18 overlies the solder resist 17 and the outer peripheral region of the land 15. The coating layer 18 over the second surface shown in FIGS. 16 and 17 and described in this second embodiment is the same as the coating layer 18 shown in FIGS. 6 and 7 and described in the first embodiment. The coating layer 18 has a circle-shaped opening. The inner periphery 18-1 of the coating layer 18 encompasses the inner periphery 15B of the land 15, while the inner periphery 18-1 of the coating layer 18 is encompassed by the outer periphery 15A of the land 15.

On the first surface closer to the electronic part 20, the presence of the coating layer 18C, which overlies the through hole 14 and the entirety of the land 15, ensures that the entirety of the land 15 is separated from the lead-less solder 32, whereby the land 15 receives no tension from the lead-less solder 32 when the lead-less solder 32 shows the solidifying shrinkage after the soldering process for mounting the electronic part 20 onto the wiring board 10A. No tension applied to the land 15 ensures prevention to the peel of the land 15 from the surface of the copper-clad lamination substrate 11.

On the second surface opposite to the first surface, the presence of the coating layer 18, which overlies the outer peripheral region of the land 15, ensures that the outer peripheral region of the land 15 is separated from the fillet 32A of the lead-less solder 32, whereby the outer peripheral region of the land 15 receives no tension from the solidifying shrinkage of the fillet 32A of the lead-less solder 32. The inside region of the land 15, which is inside of the outer peripheral region thereof, has larger adhesion forces than the peripheral region thereof. No application of the tension or the peeling force to the outer peripheral region of the land 15 having the weak adhesion force contributes to avoid that the adhesion force "W" of the inside land region is smaller than the peeling force "T sin θ" applied to the inside land region. This may suppress the land 15 from being peeled or floated from the surface of the copper-clad lamination substrate 11.

Further, it is preferable that the coating layer 18C comprises a thermally stable elastic material such as a silicone rubber. The thermal stability of the coating layer 18C is important for a heat generation in the soldering process. The elasticity of the coating layer 18C relaxes a stress applied between the lead-less solder 32 and the lead 22 of the electronic part 20 and also another stress applied between the lead-less solder 32 and the through hole 14. The relaxation to the stress applied between the lead-less solder 32 and the lead 22 may avoid the lead-less solder 32 to be peeled from the lead 22. The other relaxation to the stress applied between the lead-less solder 32 and the through hole 14 may avoid the lead-less solder 32 to be peeled from the through hole 14.

Figure 18:
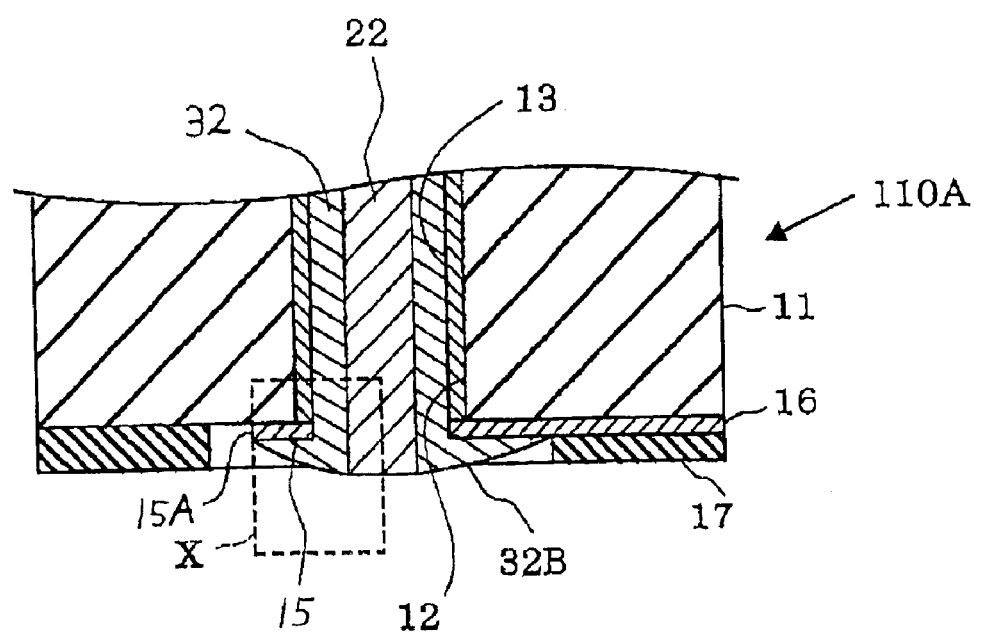
FIG. 18 is a fragmentary cross sectional elevation view of a third novel structure of a wiring board, on which the electronic part is mounted via the through holes in a third embodiment in accordance with the present invention.
Figure 19:
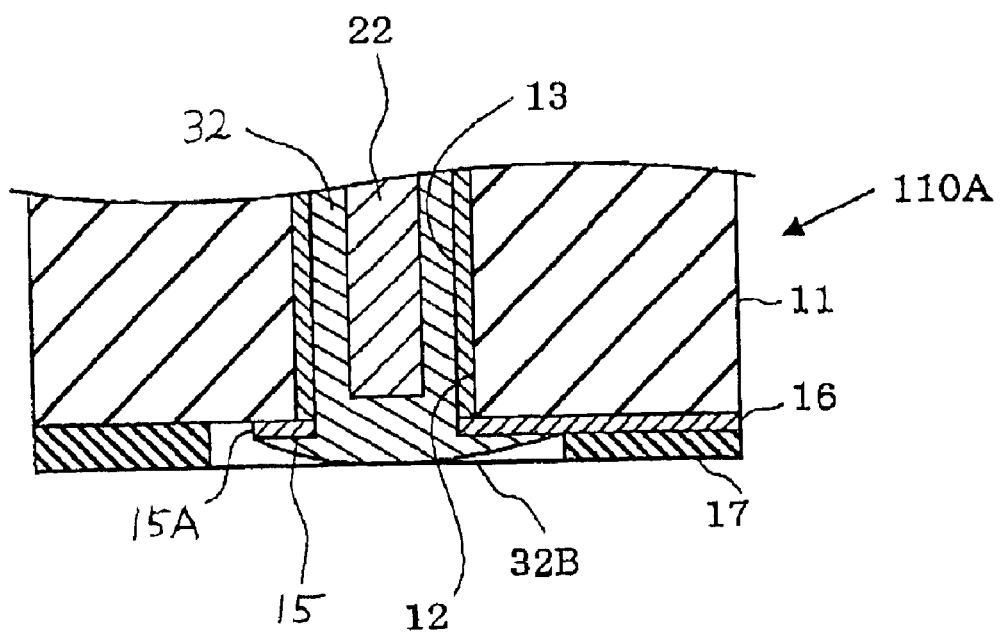
FIG. 19 is a fragmentary cross sectional elevation view of a first modification to the third novel structure of a wiring board, on which the electronic part is mounted via the through holes in a first modification to the third embodiment in accordance with the present invention.

Third Embodiment:

A third embodiment according to the present invention will be described in detail with reference to the drawings. FIG. 18 is a fragmentary cross sectional elevation view of a third novel structure of a wiring board, on which the electronic part is mounted via the through holes in a third embodiment in accordance with the present invention. FIG. 19 is a fragmentary cross sectional elevation view of a first modification to the third novel structure of a wiring board, on which the electronic part is mounted via the through holes in a first modification to the third embodiment in accordance with the present invention.

As shown in FIGS. 18 and 19, a wiring board 110A of this embodiment is different only in no provision of any coating layer on the second surface of the copper-clad lamination substrate 11 from the above-described wiring boards 10, 10A, 10B and 10C of the first embodiment, the first and second modifications to the first embodiment and the second embodiment in accordance with the present invention. In this embodiment, the lead 22 of the electronic part 20 projects at a small length from the second surface of the copper-clad lamination substrate 11. A projecting length of the lead 22 is defined to be a length of a projecting portion of the lead 22, wherein the projecting portion projects from the second surface of the copper-clad lamination substrate 11.

In this embodiment, as shown in FIG. 18, the projecting length of the lead 22 is not larger than a half of a horizontal size of the land 15 on the second surface of the copper-clad lamination substrate 11 in parallel to the second surface of the copper-clad lamination substrate 11. As described above, in the typical example, the land 15 has a circle-shape. In this case, the projecting length of the lead 22 is not larger than a half of a radius of the land 15 on the second surface of the copper-clad lamination substrate 11. If the projecting length of the lead 22 is not larger than one half of the horizontal size of the land 15 on the second surface of the copper-clad lamination substrate 11, then the soldering process by use of the lead-less solder 32 forms a flat fillet 32B of the lead-less solder 32, wherein the flat fillet 32B is in contact directly with the entirety of the land 15 because of no provision of any coating layer.

In the first modification to the third embodiment, as shown in FIG. 19, the lead 22 is free of any projecting part. Namely, the end of the lead 22 is within the through hole 14. The projecting length of the lead 22 is zero. If the projecting length of the lead 22 is not larger than one half of the horizontal size of the land 15 on the second surface of the copper-clad lamination substrate 11, then the soldering process by use of the lead-less solder 32 forms a flat fillet 32B of the lead-less solder 32, wherein the flat fillet 32B is in contact directly with the entirety of the land 15 because of no provision of any coating layer.

Figure 20:
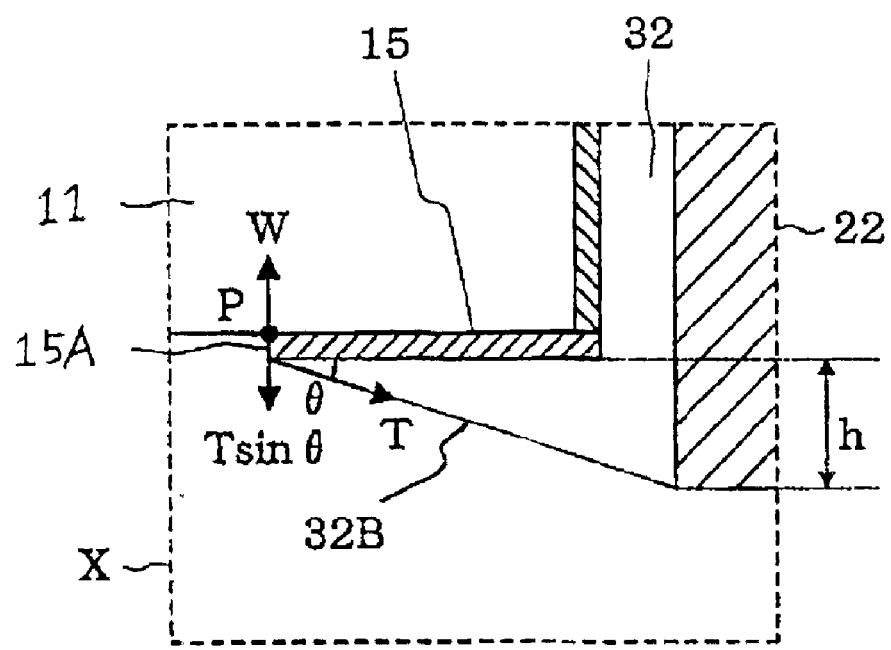
FIG. 20 is a fragmentary enlarged cross sectional elevation view, encompassed in a rectangle shape by a broken line X, illustrative of a mechanism of causing the peel of the land of the wiring board shown in FIGS. 18 and 19.

The formation of the flat fillet 32B of the lead-less solder 32, under the condition that the projecting length of the lead 22 is not larger than one half of the horizontal size of the land 15 on the second surface of the copper-clad lamination substrate 11, is effective to avoid the land 15 from being peeled by an applied tension caused by the solidifying shrinkage of the lead-less solder 32, for the following reasons. FIG. 20 is a fragmentary enlarged cross sectional elevation view, encompassed in a rectangle shape by a broken line X, illustrative of a mechanism of causing the peel of the land of the wiring board shown in FIGS. 18 and 19.

After the soldering process, the melt lead-less solder 32 with the flat fillet 32B is cooled and shows a solidifying shrinkage. As shown in FIG. 20, the solidifying shrinkage of the lead-less solder 32 with the flat fillet 32B applies a force or a tension to the land 15. For example, a position "P" of the outer periphery 15A of the land 15 is applied with a tension "T" which is directed along a slope direction of the base portion of the flat fillet 32B of the lead-less solder 32, wherein the slope direction has a small included angle "$\theta$" to the surface of the land 15. The tension "T" has a vertical component "T sin $\theta$" which is vertical to the surface of the land 15. The vertical component "T sin $\theta$" of the applied tension "T" to the land 15 opposes to an adhesion force "W" effective for adhering or securing the land 15 to the surface of the copper-clad lamination substrate 11. The vertical component "T sin $\theta$" may be considered to be a peeling force to peel the land 15 from the surface of the copper-clad lamination substrate 11. The adhesion force "W" is opposed to the peeling force "T sin $\theta$".

The peel of the land 15 is caused if the peeling force "T sin $\theta$" is larger than the adhesion force "W". The adhesion force "W" becomes weaken as the position becomes outwardly, and becomes stronger as the position becomes inwardly. The flat fillet 32B makes the small included angle "$\theta$" of the tension "T" to the surface of the land 15. The small included angle "$\theta$" means that the small peeling force "T sin $\theta$" is small. Namely, the land 15 receives the small tension or the small peeling force "T sin $\theta$" when the lead-less solder 32 shows the solidifying shrinkage. As long as the small peeling force "T sin $\theta$" is smaller than the weakest adhering force "W" at the outer periphery of the land 15, the application of the small peeling force "T sin $\theta$" to the land 15 ensures suppressing the land 15 from being peeled or floated from the surface of the copper-clad lamination substrate 11.

One example of the projecting length of the lead 22 which satisfies the above-described conditions for the projecting length may be not larger than 1 millimeter.

Figure 21:
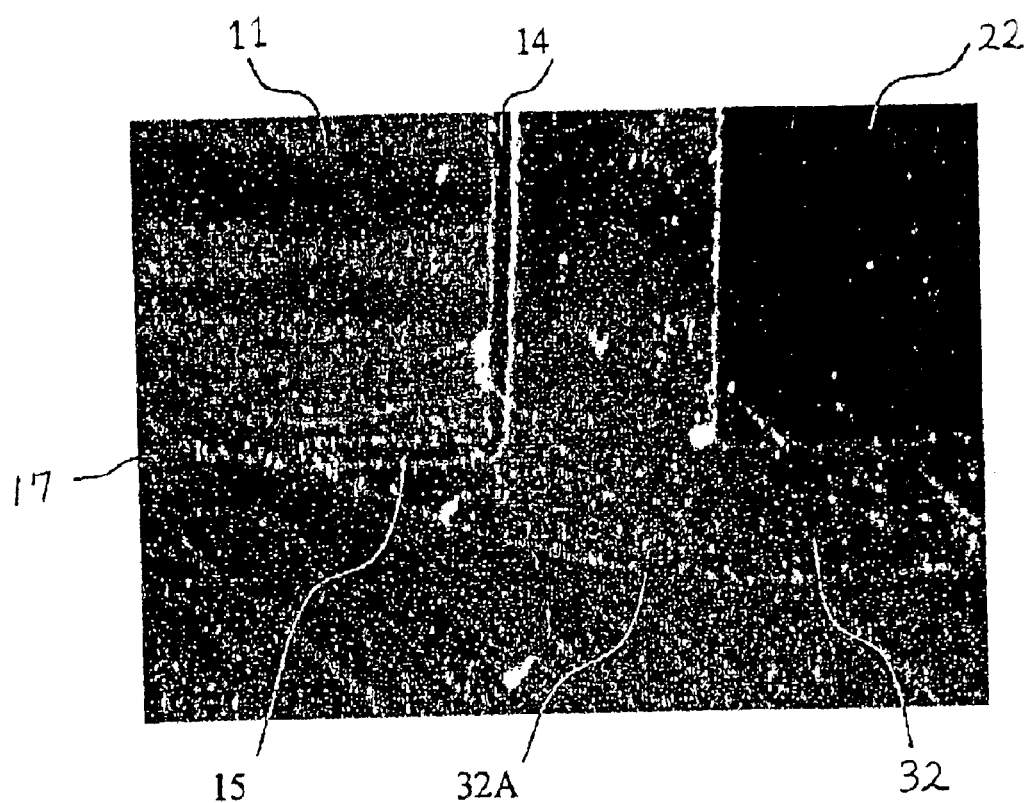
FIG. 21 is a photograph showing that the land, which is in contact with the flat fillet of the lead-less solder, is free of any peel from the surface of the copper-clad lamination substrate in the third embodiment in accordance with the present invention.

An investigation on the reliability of the electronic device, wherein the electronic part 20 is mounted on the wiring board 110A via the lead-less solder 32, was taken place. FIG. 21 is a photograph showing that the land 15, which is in contact with the flat fillet 32B of the lead-less solder 32 on the second surface of the copper-clad lamination substrate 11, is free of any peel from the surface of the copper-clad lamination substrate 11, after the temperature cyclic test has been carried out. After the soldering process by use of the lead-less solder 32 is taken place to mount the electronic part 20 onto the wiring board 10B, then 200 cycles of heating and cooling processes are taken place as a temperature cyclic test in order to apply a thermal stress to the wiring board 110A under the same conditions of the above-described temperature cyclic test in the first embodiment. As shown in FIG. 21, the land 15 is in contact with or covered by the flat fillet 32B entirely. No peel of the land 15 was observed. It was confirmed and demonstrated that the condition that the projecting length of the lead 22 is not larger than one half of the horizontal size of the land 15 on the second surface of the copper-clad lamination substrate 11 forms the flat fillet 32B in contact with the entirety of the land 15, and the flat fillet 32B causes a small peeling force to be applied to the land 15, whereby the above-described condition for the projecting length of the lead 22 is effective to ensure the prevention of the land 15 from the peel.

Consequently, the above-described strict conditions, that the projecting length of the lead 22 is not larger than one half of the horizontal size of the land 15 on the second surface of the copper-clad lamination substrate 11, ensures formation of the flat fillet 32B of the lead-less solder 32 through the soldering process for mounting the electronic part 20 onto the wiring board 110A free of any coating layer, so that the solidifying shrinkage of the lead-less solder 32 causes the flat fillet 32B to apply the small peeling force "T sin $\theta$" to the land 15, thereby to suppress the peel of the land 15. This allows the electronic device to have a long life-time and a high reliability. It is easy to satisfy the above-described strict conditions for the projecting length of the lead 22 by adjusting the projecting length of the lead 22 at a low cost. The suppression of the peel of the land 15 to manufacture the electronic device with the long life-time and the high reliability can be realized at a low cost.

The above described technique for mounting the electronic part 20 onto the wiring board 110A in accordance with this embodiment of the present invention is applicable to not only the process for formation of the new product but also the other process for repairing the used product by changing the defective or failure electronic part to the new non-defective electronic part. In case that the defective or failure electronic part is mounted on the wiring board 110A free of any coating layer, then the defective or failure electronic part is removed from the wiring board 110A, before the new non-defective electronic part 20 is, in place, mounted onto the wiring board 110A by use of the lead-less solder 32 with simple adjustment of the lead 22 of the electronic part 20 so as to satisfy the above-described conditions for the projecting length of the lead 22, thereby preparing the electronic device by use of the lead-less solder 32 without disposal of the wiring board 110A or any further process for the wiring board 110A.

The plan outer shape of the land 15 is optional and is not limited to one or more particular shapes. Typical examples of the plan outer shape of the land 15 may include, but not limited to, not only circle, but also an ellipse, polygons, cross-shapes, star-shapes, and deformations thereof.

The sectioned shape of the lead 22 in a plan vertical to a longitudinal direction of the lead 22 is optional and is not limited to one or more particular shapes. Typical examples of the sectioned shape of the lead 22 may include, but not limited to, not only circle, but also an ellipse, polygons, cross-shapes, star-shapes, and deformations thereof.

Typical examples of the lead-less solder 32 may include, but not limited to, tin-zinc-based solders, tin-silver-based solders, and tin-copper-based solders. One typical example of the compositions of the tin-zinc-based solders may be tin-zinc eutectic compositions, for example, Sn-9.0 wt % Zn. The content of zinc may vary and also one or more additional elements may be added. Another typical example is Sn-8.0 wt % Zn-3.0 wt % Bi.

One typical example of the compositions of the tin-silver-based solders may be tin-silver eutectic compositions, for example, Sn-3.5 wt % Ag. The content of silver may vary and also one or more additional elements may be added. Other typical examples are Sn-3.0 wt % Ag-0.5 wt % Cu, and Sn-3.5 wt % Ag-0.75 wt % Cu.

One typical example of the compositions of the tin-copper-based solders may be tin-copper eutectic compositions, for example, Sn-0.7 wt % Cu. The content of copper may vary and also one or more additional elements may be added. Another typical example is Sn-0.7 wt % Cu-0.3 wt % Ag. It is also possible to add a small amount of lead to the lead-less solder 32 as long as the property of the lead-less solder 32 is not substantially changed.

Figure 22:
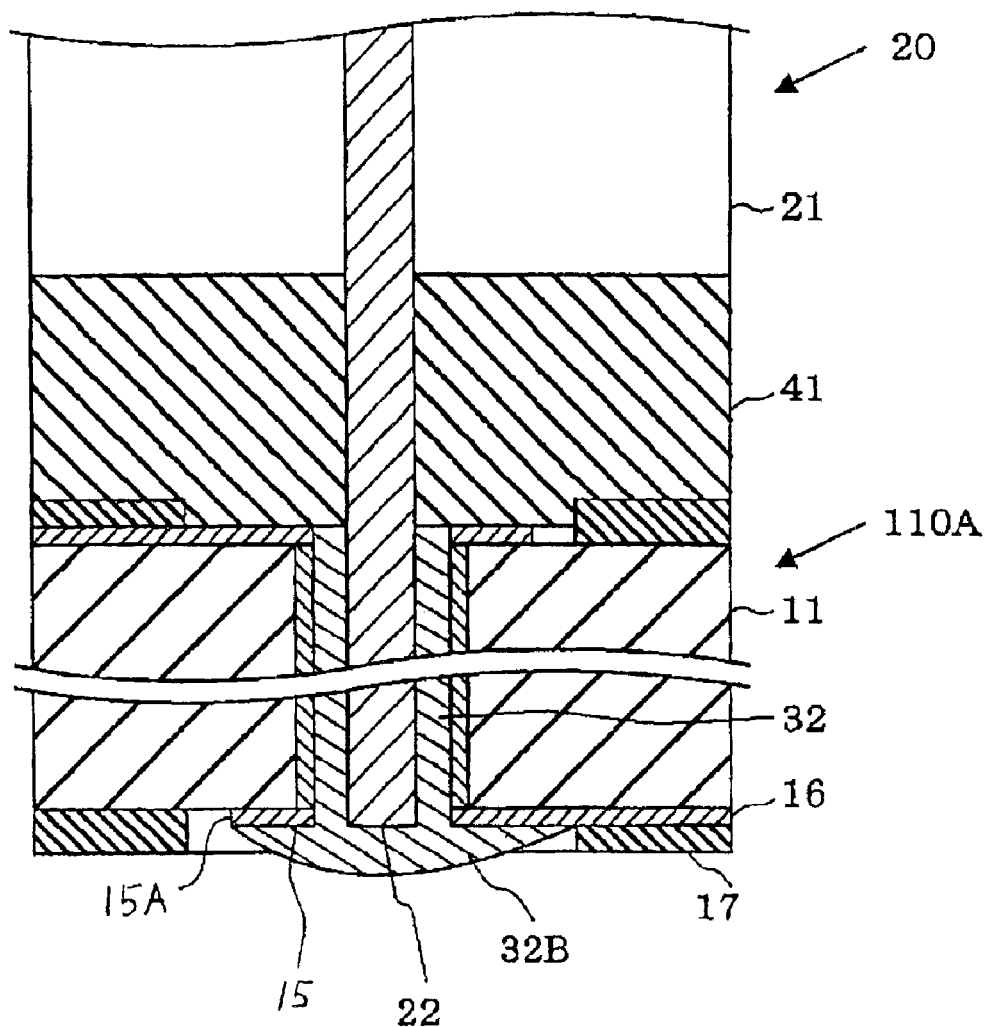
FIG. 22 is a fragmentary cross sectional elevation view of a fourth novel structure of a wiring board with through holes for mounting an electronic part thereon in a fourth embodiment in accordance with the present invention.

Fourth Embodiment:

A fourth embodiment according to the present invention will be described in detail with reference to the drawings. FIG. 22 is a fragmentary cross sectional elevation view of a fourth novel structure of a wiring board with through holes for mounting an electronic part thereon in a fourth embodiment in accordance with the present invention.

As shown in FIG. 22, a wiring board 110A of this embodiment is different, in no provision of any coating layer on the second surface of the copper-clad lamination substrate 11 and also in an additional provision of a spacer 41 between the first surface of the copper-clad lamination substrate 11 and the electronic part 20, from the above-described wiring boards 10, 10A, 10B and 10C of the first embodiment, the first and second modifications to the first embodiment and the second embodiment in accordance with the present invention.

In this embodiment, the end of the lead 22 of the electronic part 20 does not project from but does level to the surface of the land 15 or the second surface of the copper-clad lamination substrate 11. As described in the above third embodiment, the zero projecting length of the lead 22 causes the soldering process by use of the lead-less solder 32 to form a flat fillet 32B of the lead-less solder 32, wherein the flat fillet 32B is in contact directly with the entirety of the land 15 because of no provision of any coating layer. The effects caused by the zero projecting length of the lead 22 are as described above in the third embodiment.

In this embodiment, the spacer 41 is interposed between the first surface of the copper-clad lamination substrate 11 and the body 21 of the electronic part 20, in order to adjust the projecting length of the lead 22, so as to satisfy the above-described conditions that the projecting length of the lead 22 is not larger than a half of the horizontal size of the land 15 on the second surface of the copper-clad lamination substrate 11 in parallel to the second surface of the copper-clad lamination substrate 11. As described above, in the typical example, the land 15 has a circle-shape. In this case, the projecting length of the lead 22 is not larger than a half of a radius of the land 15 on the second surface of the copper-clad lamination substrate 11. If the projecting length of the lead 22 is not larger than one half of the horizontal size of the land 15 on the second surface of the copper-clad lamination substrate 11, then the soldering process by use of the lead-less solder 32 forms a flat fillet 32B of the lead-less solder 32, wherein the flat fillet 32B is in contact directly with the entirety of the land 15 because of no provision of any coating layer. Adjustment to the projecting length of the lead 22 may be made by adjustment to a thickness or a height of the spacer 41. Increasing the thickness or height of the spacer 41 decreases the projecting length of the lead 22. Decreasing the thickness or height of the spacer 41 increases the projecting length of the lead 22.

The spacer 41 is provided on the entirety of the first surface of the copper-clad lamination substrate 11, before the leads 22 of the electronic part 20 penetrate through the spacer 41 and insert into the through holes 14 for subsequent soldering process for bonding the leads 22 to the through holes 14 via the lead-less solder 32.

As shown in FIG. 22, in one typical example, the spacer 41 extends over the entirety of the gap or the inter-space between the body 21 of the electronic part 20 and the first surface of the copper-clad lamination substrate 11. The spacer 41 performs the same function as the coating layer 18B or 18C shown in FIGS. 12–13 and 16–17. On the first surface of the copper-clad lamination substrate 11, the presence of the spacer 41, which overlies the through hole 14 and the entirety of the land 15, ensures that the entirety of the land 15 is separated from the lead-less solder 32, whereby the land 15 receives no tension from the lead-less solder 32 when the lead-less solder 32 shows the solidifying shrinkage after the soldering process for mounting the electronic part 20 onto the wiring board 10A. No tension applied to the land 15 ensures prevention to the peel of the land 15 from the surface of the copper-clad lamination substrate 11.

Figure 23:
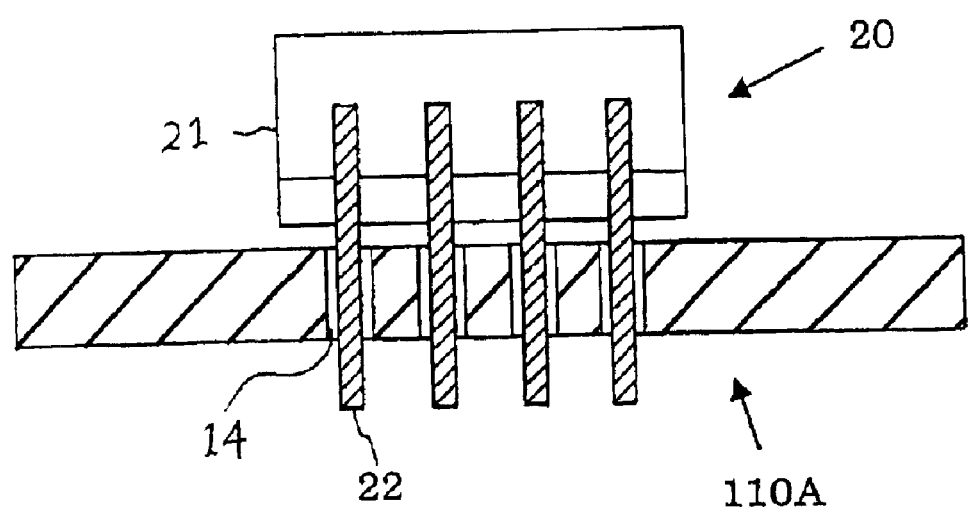
FIG. 23 is a cross sectional elevation view of an electronic device, wherein the electronic part is mounted on the wiring board without any spacer, whereby the leads include projecting parts which project from the second surface of the wiring board.
Figure 24:
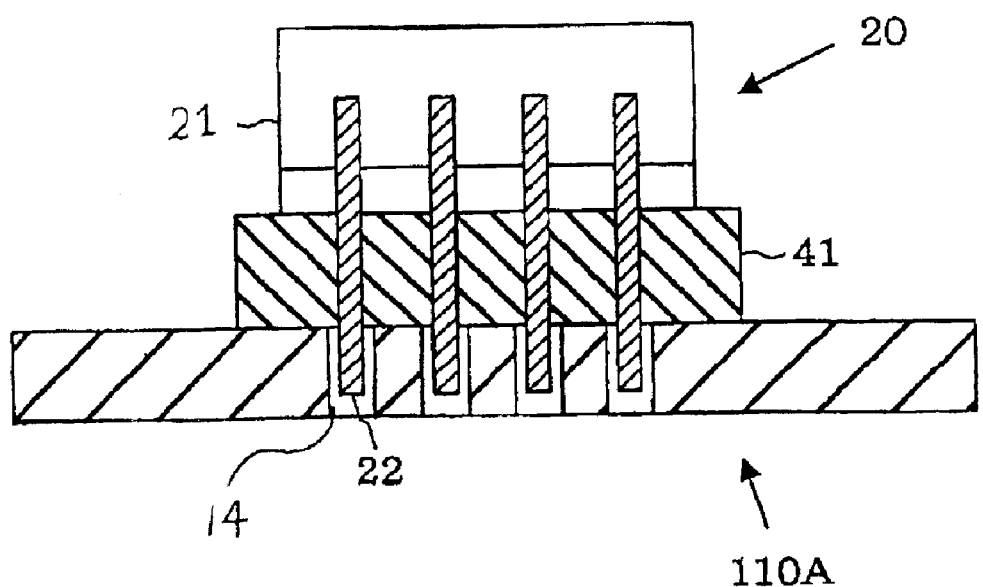
FIG. 24 is a cross sectional elevation view of another electronic device, wherein the electronic part is mounted on the wiring board with the spacer interposed between the body of the electronic part and the first surface of the wiring board, whereby the leads do not include any projecting parts in the fourth embodiment in accordance with the present invention.

FIG. 23 is a cross sectional elevation view of an electronic device, wherein the electronic part 20 is mounted on the wiring board 110A without any spacer, whereby the leads 22 include projecting parts which project from the second surface of the wiring board 110A. FIG. 24 is a cross sectional elevation view of another electronic device, wherein the electronic part 20 is mounted on the wiring board 110A with the spacer 41 interposed between the body 21 of the electronic part 20 and the first surface of the wiring board 110A, whereby the leads 22 do not include any projecting parts. FIGS. 23 and 24 show that adjustment to the projecting length of the lead 22 may be made by adjustment to a thickness or a height of the spacer 41. Increasing the thickness or height of the spacer 41 decreases the projecting length of the lead 22. Decreasing the thickness or height of the spacer 41 increases the projecting length of the lead 22.

Consequently, interposing the spacer 41 between the first surface of the copper-clad lamination substrate 11 and the body 21 of the electronic part 20 makes it easy to satisfy the above-described strict conditions, that the projecting length of the lead 22 is not larger than one half of the horizontal size of the land 15 on the second surface of the copper-clad lamination substrate 11. The satisfaction to the above-described strict conditions for the projecting length ensures formation of the flat fillet 32B of the lead-less solder 32 through the soldering process for mounting the electronic part 20 onto the wiring board 110A free of any coating layer, so that the solidifying shrinkage of the lead-less solder 32 causes the flat fillet 32B to apply the small peeling force "T sin θ" to the land 15, thereby to suppress the peel of the land 15. This allows the electronic device to have a long life-time and a high reliability. The suppression of the peel of the land 15 to manufacture the electronic device with the long life-time and the high reliability can be realized at a low cost.

Figure 25:
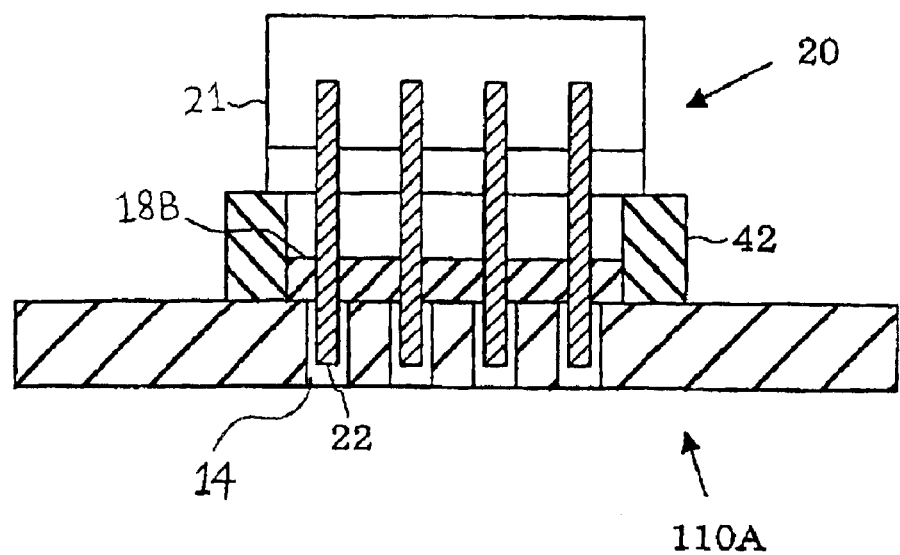
FIG. 25 is a cross sectional elevation view of an electronic device, wherein the electronic part is mounted on the wiring board through the spacer which extends long the outer-periphery of the body of the electronic part in a first modification to the fourth embodiment in accordance with the present invention.
Figure 26:
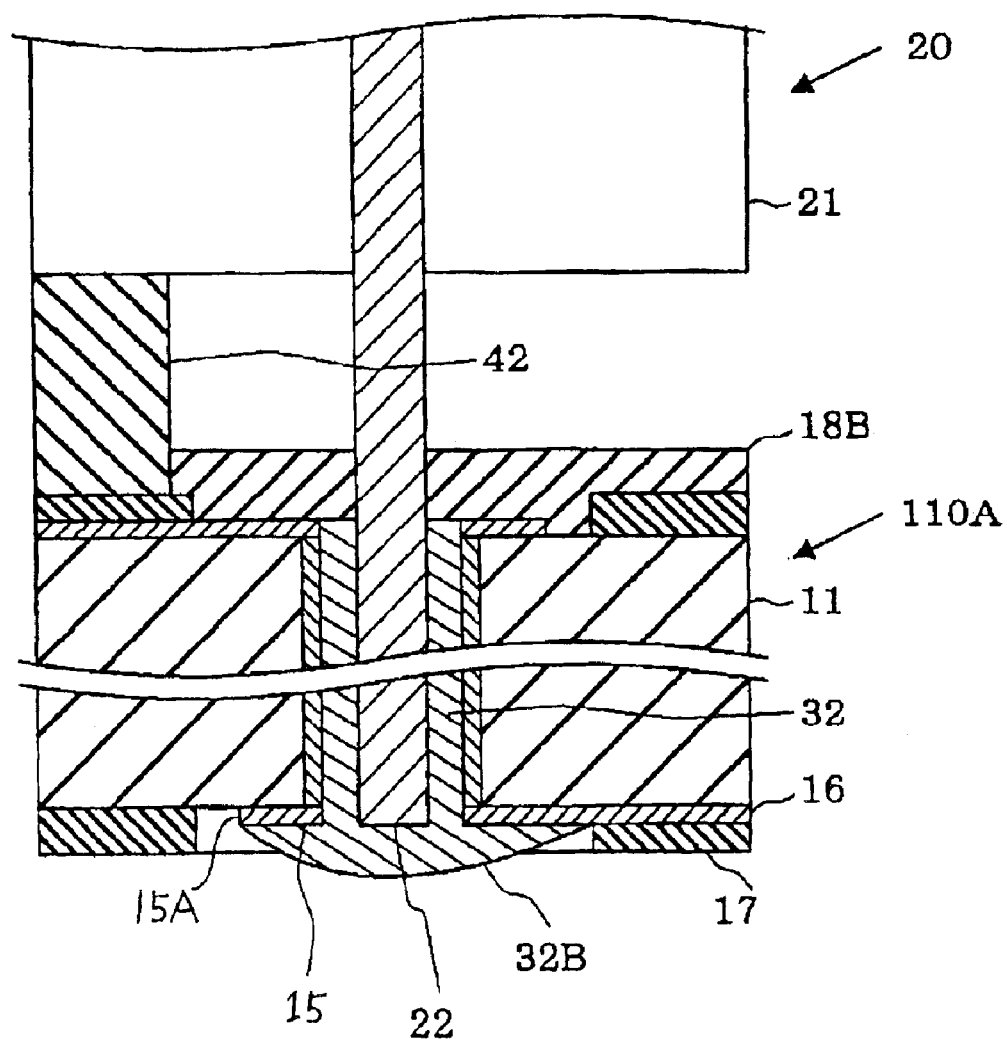
FIG. 26 is a fragmentary enlarged cross sectional elevation view of a part of the electronic device shown in FIG. 25.

It is possible as a first modification to the fourth embodiment that a spacer 42 is interposed between the body 21 of the electronic part 20 and the first surface of the copper-clad lamination substrate 11. FIG. 25 is a cross sectional elevation view of an electronic device, wherein the electronic part 20 is mounted on the wiring board 110A through the spacer 42 which extends long the outer-periphery of the body 21 of the electronic part 20. FIG. 26 is a fragmentary enlarged cross sectional elevation view of a part of the electronic device shown in FIG. 25. The spacer 42 selectively extends along the entirety of an outer-periphery of the body 21 of the electronic part 20 in order to satisfy the above-described conditions for the projecting length of the lead 22. Further, the coating layer 18B is additionally provided on the center region of the inter-space between the body 21 of the electronic part 20 and the first surface of the copper-clad lamination substrate 11, wherein the coating layer 18B is surrounded by the spacer 42. The coating layer 18B is the same as shown in FIGS. 12 and 13 and described in the second modification to the first embodiment of the present invention. It is further possible that instead of the coating layer 18C, the other coating layer 18 or 18A is additionally provided on the center region of the inter-space between the body 21 of the electronic part 20 and the first surface of the copper-clad lamination substrate 11, wherein the coating layer 18 or 18A is surrounded by the spacer 42. The coating layers 18 and 18A are the same as shown in FIGS. 6–7 and 10–11, and described in the first embodiment and the first modification to the first embodiment of the present invention.

Consequently, interposing the spacer 42 between the first surface of the copper-clad lamination substrate 11 and the body 21 of the electronic part 20 makes it easy to satisfy the above-described strict conditions, that the projecting length of the lead 22 is not larger than one half of the horizontal size of the land 15 on the second surface of the copper-clad lamination substrate 11. The satisfaction to the above-described strict conditions for the projecting length ensures formation of the flat fillet 32B of the lead-less solder 32 through the soldering process for mounting the electronic part 20 onto the wiring board 110A free of any coating layer, so that the solidifying shrinkage of the lead-less solder 32 causes the flat fillet 32B to apply the small peeling force "T sin θ" to the land 15, thereby to suppress the peel of the land 15. This allows the electronic device to have a long life-time and a high reliability. The suppression of the peel of the land 15 to manufacture the electronic device with the long life-time and the high reliability can be realized at a low cost.

A variety of materials, which are thermally stable at a substrate surface temperature in the soldering process, may be available for the spacers 41 and 42. Typical examples of the available materials for the spacers 41 and 42 may include, but not limited to, metals such as nickel, thermally stable resins such as an epoxy resin, and a thermally stable silicone rubber.

Figure 27:
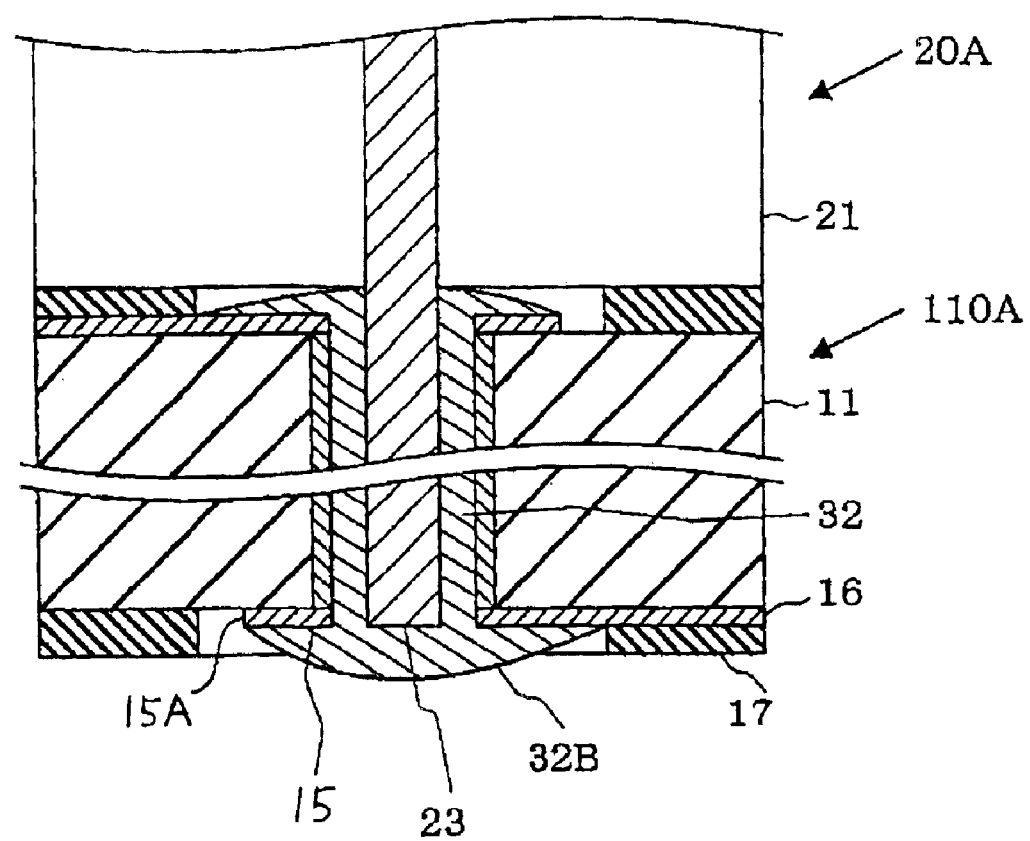
FIG. 27 is a fragmentary cross sectional elevation view of a fifth novel structure of a wiring board with through holes for mounting an electronic part thereon in a fifth embodiment in accordance with the present invention.

Fifth Embodiment:

A fifth embodiment according to the present invention will be described in detail with reference to the drawings. FIG. 27 is a fragmentary cross sectional elevation view of a fifth novel structure of a wiring board with through holes for mounting an electronic part thereon in a fifth embodiment in accordance with the present invention.

As shown in FIG. 27, a wiring board 110A of this embodiment is different, in no provision of any coating layer on the second surface of the copper-clad lamination substrate 11, from the above-described wiring boards 10, 10A, 10B and 10C of the first embodiment, the first and second modifications to the first embodiment and the second embodiment in accordance with the present invention.

In this embodiment, the end of the lead 22 of the electronic part 20 does not project from but does level to the surface of the land 15 or the second surface of the copper-clad lamination substrate 11. As described in the above third embodiment, the zero projecting length of the lead 22 causes the soldering process by use of the lead-less solder 32 to form a flat fillet 32B of the lead-less solder 32, wherein the flat fillet 32B is in contact directly with the entirety of the land 15 because of no provision of any coating layer. The effects caused by the zero projecting length of the lead 22 are as described above in the third embodiment.

The length of the lead 22 is decided, so as to satisfy the above-described conditions that the projecting length of the lead 22 is not larger than a half of the horizontal size of the land 15 on the second surface of the copper-clad lamination substrate 11 in parallel to the second surface of the copper-clad lamination substrate 11. As described above, in the typical example, the land 15 has a circle-shape. In this case, the projecting length of the lead 22 is not larger than a half of a radius of the land 15 on the second surface of the copper-clad lamination substrate 11. If the projecting length of the lead 22 is not larger than one half of the horizontal size of the land 15 on the second surface of the copper-clad lamination substrate 11, then the soldering process by use of the lead-less solder 32 forms a flat fillet 32B of the lead-less solder 32, wherein the flat fillet 32B is in contact directly with the entirety of the land 15 because of no provision of any coating layer. Adjustment to the projecting length of the lead 22 may be made by adjustment to a thickness or a height of the spacer 41. Increasing the thickness or height of the spacer 41 decreases the projecting length of the lead 22. Decreasing the thickness or height of the spacer 41 increases the projecting length of the lead 22.

In this embodiment, an electronic part 20A is mounted on the wiring board 110A, so that a body 21 of the electronic part 20A is in contact with the solder resist 17 on the first surface of the copper-clad lamination substrate 11. The presence of the body 21 causes that the soldering process forms another flat fillet 32B which is in contact with the land 15 over the first surface of the copper-clad lamination substrate 11.

Consequently, the provision of the body 21 in contact with the solder resist 17 on the first surface of the copper-clad lamination substrate 11 results in the formation of the flat fillet 32B in contact with the land 15 on the first surface of the copper-clad lamination substrate 11. The satisfaction is ensured to the above-described strict conditions, that the projecting length of the lead 22 is not larger than one half of the horizontal size of the land 15 on the second surface of the copper-clad lamination substrate 11. The flat fillets 32B on the first and second surfaces of the copper-clad lamination substrate 11 apply the small peeling force "T sin θ" to the land 15 upon the solidifying shrinkage of the lead-less solder 32, thereby to suppress the peel of the land 15. This allows the electronic device to have a long life-time and a high reliability. The suppression of the peel of the land 15 to manufacture the electronic device with the long life-time and the high reliability can be realized at a low cost.

In this embodiment, the adjustment to the projecting length of the lead 22 from the second surface of the copper-clad lamination substrate 11 is made by adjustment to the full length of the lead 22. Adjustment to the full length of the lead 22 may be made by shortening the original length of the lead 22 after the lead 22 has been attached to the body 21 of the electronic part 20A or by preparing the length-adjusted lead 22 and attaching the same to the body 21 of the electronic part 20A.

Figure 28A:
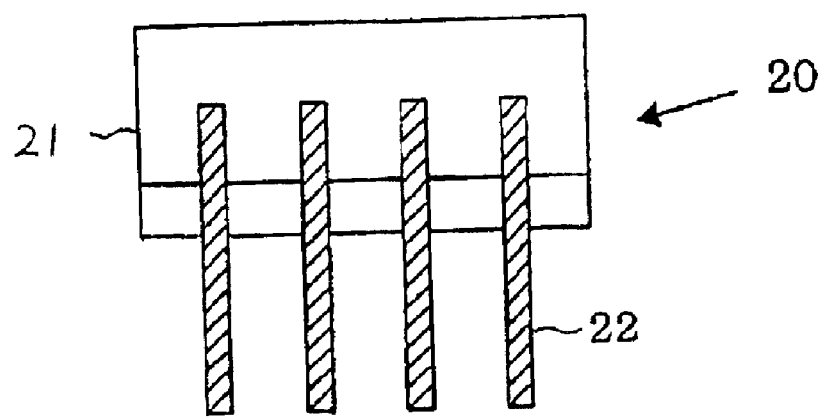
FIGS. 28A through 28C are cross sectional elevation views illustrative of sequential processes for mounting the electronic part onto the wiring board in the fifth embodiment in accordance with the present invention.
Figure 28B:
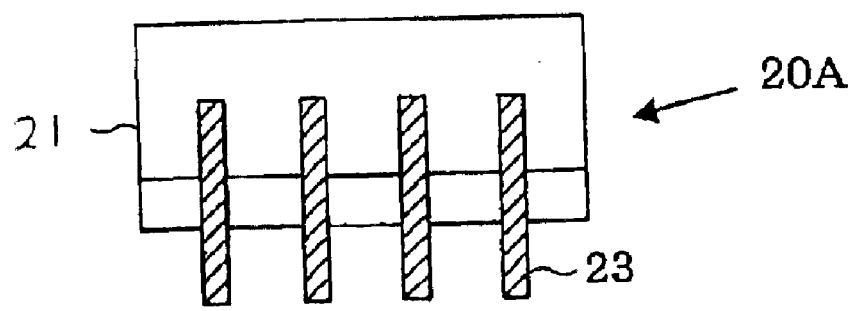
Figure 28C:
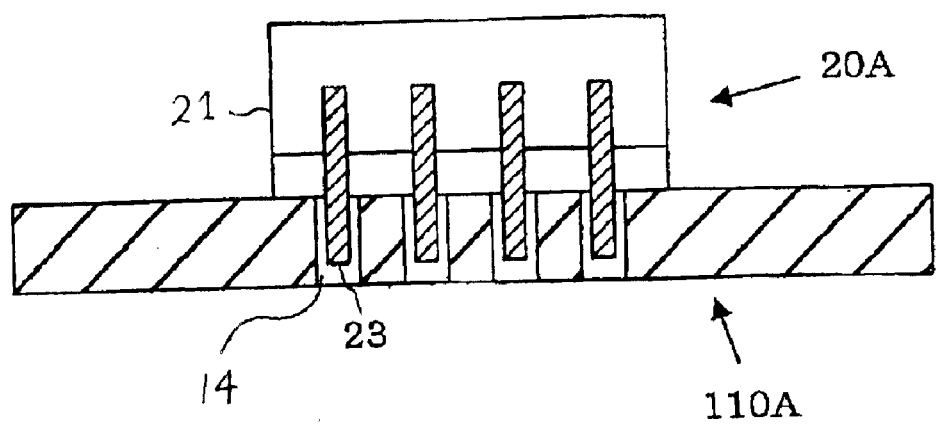

FIGS. 28A through 28C are cross sectional elevation views illustrative of sequential processes for mounting the electronic part 20 onto the wiring board 110A. As shown in FIG. 28A, leads 22 with the original full length are attached to the body 21, thereby to form an electronic part 20. As shown in FIG. 28B, the leads 22 are cut to shorten the original full length into a shortened length, thereby to form an electronic part 20A with length-adjusted leads 23. As shown in FIG. 28C, the electronic part 20A with the length-adjusted leads 23 are mounted onto the wiring board 110A by the soldering process using the lead-less solder 23, wherein the length-adjusted leads 23 are inserted into the through holes 14 of the wiring board 110A. The length-adjusted leads 23 do not project from the second surface of the wiring board 110A.

Figure 29:
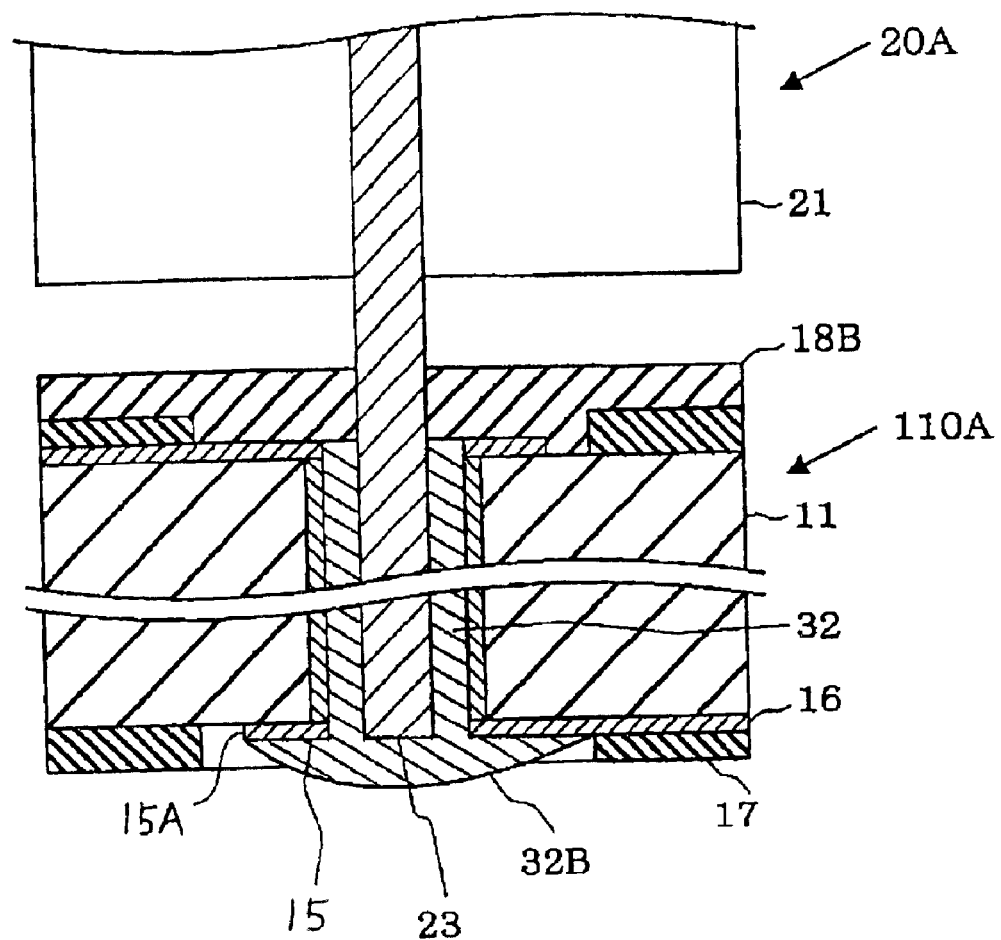
FIG. 29 is a fragmentary cross sectional elevation view of an electronic device, wherein the electronic part is mounted on the wiring board in a first modification to the fifth embodiment in accordance with the present invention.

FIG. 29 is a fragmentary cross sectional elevation view of an electronic device, wherein the electronic part 20A is mounted on the wiring board 110A in a first modification to the fifth embodiment in accordance with the present invention. If the body 21 of the electronic part 20A is poor in thermal stability at a substrate surface temperature of the soldering process, then the electronic part 20A is mounted on the wiring board 110A, so that the body 21 is spaced apart from the first surface of the copper-clad lamination substrate 11, and further any one of the coating layers 18, 18A, 18B and 18C is provided on the first surface of the copper-clad lamination substrate 11.

Figure 30:
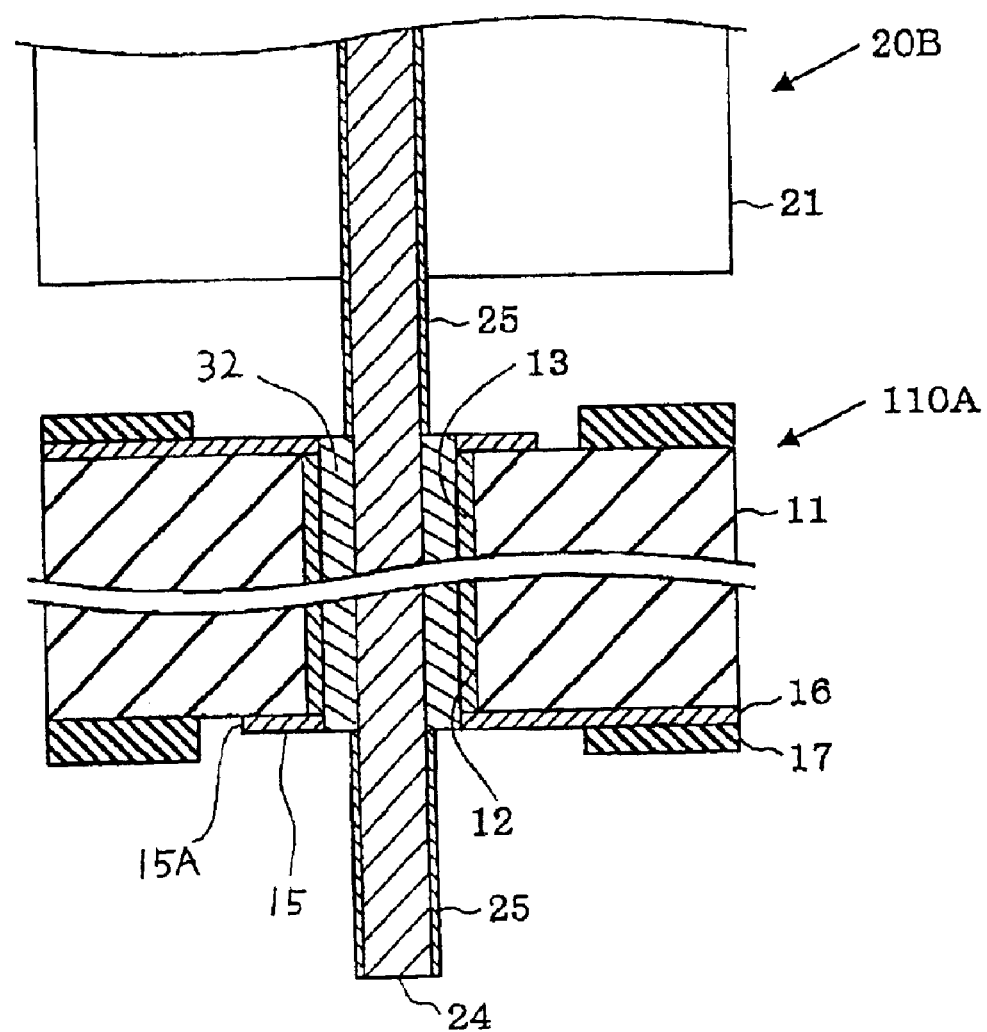
FIG. 30 is a fragmentary cross sectional elevation view of a sixth novel structure of a wiring board with through holes for mounting an electronic part thereon in a sixth embodiment in accordance with the present invention.

Sixth Embodiment:

A sixth embodiment according to the present invention will be described in detail with reference to the drawings. FIG. 30 is a fragmentary cross sectional elevation view of a sixth novel structure of a wiring board with through holes for mounting an electronic part thereon in a sixth embodiment in accordance with the present invention.

As shown in FIG. 30, a wiring board 110A of this embodiment is different, in no provision of any coating layer on both the first and second surfaces of the copper-clad lamination substrate 11, from the above-described wiring boards 10, 10A, 10B and 10C of the first embodiment, the first and second modifications to the first embodiment and the second embodiment in accordance with the present invention. Further, each of the leads 24 has coating films 25 which coat the lead 24, except for an insertion region which inserts in the through hole 14 of the copper-clad lamination substrate 11. The length of the insertion region of the land 24 is substantially the same as the length of the through hole 14. The electronic part 20B is mounted on the wiring board 110A, so that the insertion region is aligned to the through hole 14. The projecting parts of the lead 24, which project from the through hole 14 or the first and second surfaces of the copper-clad lamination substrate 11, are coated with the coating films 25. The coating film 25 prevents the lead-less solder 23 to be applied onto the coating film 25 or onto the projecting parts of the lead 24, whereby the lead-less solder 23 is confined within the through hole 14 as shown in FIG. 30. Namely, no fillets are formed between the land 15 and the projecting part of the lead 24 on each of the first and second surfaces of the copper-clad lamination substrate 11. The insertion region of the lead 24 is bonded through the lead-less solder 32 to the through hole 14.

The presence of the coating films 25 which coat the projecting parts of the lead 24 ensures that no fillets are formed, and the lead-less solder 32 are confined within the through hole 14, whereby the entirety of the land 15 is separated from the lead-less solder 32. The land 15 receives no tension from the lead-less solder 32 when the lead-less solder 32 shows the solidifying shrinkage after the soldering process for mounting the electronic part 20 onto the wiring board 110A. No tension applied to the land 15 ensures prevention to the peel of the land 15 from the surface of the copper-clad lamination substrate 11. This allows the electronic device to have a long life-time and a high reliability.

The manufacturing cost for the coating films 25 is lower than the manufacturing cost for the above-described solder resist 117 shown in FIG. 5. The use of the coating films 25 instead of the above-described solder resist 117 realizes suppression to the peel of the land 15 and allows the electronic device to have a long life-time and a high reliability at the low cost.

The coating films 25 should have a thermal stability at a melting point of the lead-less solder 32 and a lower reactivity to the melt solder than the lead 24. The lead-less solder of Sn—Ag—Cu has a melting point ranged from 216° C.–217° C. If the lead-less solder of Sn—Ag—Cu is used, then the coating films 25 should have a thermal stability in the range of 216° C.–217° C. Typical examples of the available materials for the coating films 25 may include, but not limited to, metals such as nickel, thermally stable resins such as epoxy resin, and thermally stable silicone rubbers. It is possible that the coating film 25 comprises an adhesive tape which is winded to the lead 24.

The above described technique for mounting the electronic part 20B onto the wiring board 110A in accordance with the present invention is applicable to not only the process for formation of the new product but also the other process for repairing the used product by changing the defective or failure electronic part to the new non-defective electronic part. In case that the defective or failure electronic part is mounted on the wiring board 110A, then defective or failure electronic part is removed from the wiring board 110A, before the new non-defective electronic part 20B with the leads 24 partly coated with the coating films 25 is mounted onto the wiring board 110A by use of the lead-less solder 32, thereby preparing the electronic device by use of the lead-less solder 32 without disposal of the wiring board 110A.

In the typical example of this embodiment, both the projecting parts of the lead 24 from the first and second surfaces of the copper-clad lamination substrate 11 are coated with the coating films 25 as shown in FIG. 30.

It is possible as a first modification to the sixth embodiment that one of the projecting parts of the lead 24 is coated with the coating film 25, while another side free of the coating film 25 is subjected to any one of the above-described countermeasures of the foregoing embodiments and modifications thereto.

It is also possible as a second modification to the sixth embodiment that adjacent parts to the boundaries between the insertion region and the projecting parts of the lead 24 are coated with the coating films 25.

It is also possible as a third modification to the sixth embodiment that an adjacent part to the boundary between the insertion region and one of the projecting parts of the lead 24 is coated with the coating film 25, while another side free of the coating film 25 is subjected to any one of the above-described countermeasures of the foregoing embodiments and modifications thereto.

It is obvious to the person having skills in the art that the foregoing embodiments and the modifications thereto may be effective alone or in combination.

The present invention is applicable to a variety of electronic devices. Typical examples of the electronic devices, to which the present invention is applicable may include, but not limited to, printers, facsimile machines, displays such as LCD monitors, computers such as personal computers and large scale computers, for example, server computers and super computers, switch boards or exchanges, transmitters and base station units.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. An electronic device comprising:
a wiring board comprising at least one through hole; and
an electronic part mounted on said wiring board, said electronic part comprising at least one lead inserted into said at least one through hole and bonded to said at least one through hole via a lead-less solder,
wherein said wiring board comprises:
a substrate comprising said at least one through hole; and
at least one land extending on at least one surface of said substrate, said at least one land extending adjacent to an opening of said at least one through hole,
wherein a projecting length of said at least one lead from said at least one surface of said substrate is not greater than one half of a horizontal size of said at least one land, where said projecting length being defined to be a length of a projecting part of said at least one lead, which projects from said at least one surface of said substrate, and
wherein said lead-less solder comprises a flat fillet directly contacting an entirety of said at least one land.

2. The electronic device as claimed in claim 1, wherein said projecting length is not greater than zero, and said at least one lead is free of any project part from said at least one surface of said substrate.

3. The electronic device as claimed in claim 1, wherein at least one coating layer is provided on a first surface of said substrate, and said first surface faces to said electronic part, and said at least one coating layer coats at least one part of an outer peripheral region of said at least one land, so that said at least one part of said outer peripheral region of said at least one land is separated from said lead-less solder, and
wherein a second-side projecting length of said at least one lead from a second surface of said substrate is not greater than one half of a horizontal size of said at least one land on said second surface, where said second-side projecting length is defined to be a length of a projecting part of said at least one lead, which projects from said second surface of said substrate, and said land on said second surface of said substrate is in contact with a flat fillet of said lead-less solder.

4. The electronic device as claimed in claim 3, wherein said second-side projecting length is not greater than zero, and said at least one lead is free of any second-side project part from said second surface of said substrate.

5. The electronic device as claimed in claim 3, wherein said at least one coating layer is spatially separated from said electronic part.

6. The electronic device as claimed in claim 3, wherein said at least one coating layer is in contact with said electronic part.

7. The electronic device as claimed in claim 3, wherein said projecting length comprises a length greater than zero.

8. The electronic device as claimed in claim 1, wherein at least one spacer is provided between said electronic part and a first surface of said substrate, and said first surface faces to said electronic part, so that said at least one part of said outer peripheral region of said at least one land is separated from said lead-less solder, and
wherein a second-side projecting length of said at least one lead from a second surface of said substrate is not greater than one half of a horizontal size of said at least one land on said second surface, where said second-side projecting length is defined to be a length of a projecting part of said at least one lead, which projects from said second surface of said substrate, and said land on said second surface of said substrate is in contact with a flat fillet of said lead-less solder.

9. The electronic device as claimed in claim 8, wherein said second-side projecting length is not greater than zero, and said at least one lead is free of any second-side projecting part from said second surface of said substrate.

10. The electronic device as claimed in claim 8, wherein said at least one spacer coats said land on said first surface of said substrate.

11. The electronic device as claimed in claim 8, wherein said at least one spacer does not coat said land on said first surface of said substrate, and at least one coating layer is further provided on said first surface of said substrate, and said at least one coating layer coats at least one part of an outer peripheral region of said land on said first surface of said substrate.

12. The electronic device as claimed in claim 11, wherein said at least one coating layer coats both an entirety of said land on said first surface of said substrate and a first side opening of said at least one through hole.

13. The electronic device as claimed in claim 8, wherein said projecting length comprises a length greater than zero.

14. The electronic device as claimed in claim 1, wherein said wiring board further includes:
- a first conductive film extending on an inner wall of said at least one through hole, and said first conductive film being connected with said at least one land;
- at least one circuit wiring extending on at least one surface of said substrate, and said at least one circuit wiring being connected with a connecting part of an outer peripheral region of said at least one land; and
- at least one protection film covering said at least one circuit wiring.

15. The electronic device as claimed in claim 14, wherein a confronting surface of said electronic part is adjacent to said at least one protection film, and said confronting surface faces to a first surface of said substrate, and said land on said first surface of said substrate is in contact with at least one flat fillet of said lead-less solder.

16. The electronic device as claimed in claim 1, wherein said projecting length is greater than zero and not greater than one half of a horizontal size of said at least one land.

17. The electronic device as claimed in claim 16, wherein said projecting length is not greater than 1 millimeter.

18. The electronic device as claimed in claim 1, wherein said flat fillet directly contacts said at least one land.

19. The electronic device as claimed in claim 18, wherein said flat fillet directly contacts an entirety of said at least one land.

20. The electronic device as claimed in claim 1, wherein said lead-less solder comprises at least one of a tin-zinc-based solder, a tin-silver-based solder and a tin-copper-based solder.

21. The electronic device as claimed in 20, wherein said lead-less solder comprises a composition selected from the group consisting of tin-9.0 wt % zinc, tin-8.0 wt % zinc-3.0 wt % bismuth, tin-3.5 wt % silver, tin-3.0 wt % silver-0.5 wt % copper, tin-3.5 wt % silver-0.75 wt % copper, tin-0.7 wt % copper, and tin-0.7 wt % copper-0.3 wt % silver.

22. The electronic device as claimed in claim 1, wherein said projecting length comprises a length greater than zero.

23. The electronic device as claimed in claim 1, wherein a slope of said flat fillet comprises a substantially small included angle.

24. An electronic device comprising:
- a wiring board comprising:
  - at least one through hole;
  - a substrate comprising said at least one through hole; and
  - at least one land extending on at least one surface of said substrate, said at least one land extending adjacent to an opening of said at least one through hole; and
- an electronic part mounted on said wiring board, said electronic part comprising at least one lead inserted into said at least one through hole and bonded to said at least one through hole via a lead-less solder,
- wherein said lead-less solder comprises a flat fillet directly contacting an entirety of said at least one land.

25. The electronic device as claimed in claim 24, wherein a projecting length of said at least one lead from said at least one surface of said substrate is not greater than one half of a horizontal size of said at least one land, said projecting length being defined to be a length of a projecting part of said at least one lead, which projects from said at least one surface of said substrate.

26. The electronic device as claimed in claim 25, wherein said projecting length is not greater than zero, and said at least one lead is free of any projecting part from said at least one surface of said substrate.

27. The electronic device as claimed in claim 24, wherein at least one coating layer is provided on a first surface of said substrate, and said first surface faces to said electronic part, and said at least one coating layer coats at least one part of an outer peripheral region of said at least one land, so that said at least one part of said outer peripheral region of said at least one land is separated from said lead-less solder, and
- wherein a second-side projecting length of said at least one lead from a second surface of said substrate is not greater than one half of a horizontal size of said at least one land on said second surface, said second-side projecting length being defined to be a length of a projecting part of said at least one lead, which projects from said second surface of said substrate, and said land on said second surface of said substrate is in contact with a flat fillet of said lead-less solder.

28. The electronic device as claimed in claim 24, wherein said projecting length comprises a length greater than zero.

* * * * *